US012334128B2

(12) United States Patent
Noack et al.

(10) Patent No.: US 12,334,128 B2
(45) Date of Patent: Jun. 17, 2025

(54) FERROELECTRIC MEMORY CIRCUIT AND READING METHOD THEREOF

(71) Applicant: Ferroelectric Memory GmbH, Dresden (DE)

(72) Inventors: Marko Noack, Dresden (DE); Georgi Kuzmanov, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 68 days.

(21) Appl. No.: 17/791,795

(22) PCT Filed: Jan. 8, 2021

(86) PCT No.: PCT/EP2021/050261
§ 371 (c)(1),
(2) Date: Jul. 8, 2022

(87) PCT Pub. No.: WO2021/140193
PCT Pub. Date: Jul. 15, 2021

(65) Prior Publication Data
US 2023/0041759 A1    Feb. 9, 2023

(30) Foreign Application Priority Data
Jan. 10, 2020   (DE) .................... 10 2020 100 474.5

(51) Int. Cl.
*G11C 11/22*     (2006.01)
(52) U.S. Cl.
CPC ........ *G11C 11/2273* (2013.01); *G11C 11/221* (2013.01)

(58) Field of Classification Search
CPC .............. G11C 11/2273; G11C 11/221; G11C 2207/068; G11C 7/062; G11C 7/067
See application file for complete search history.

(56) References Cited

U.S. PATENT DOCUMENTS 3,579,208 A * 5/1971 Bartlett .................. G11C 11/22
365/145
6,337,808 B1   1/2002 Forbes
(Continued)

FOREIGN PATENT DOCUMENTS

WO   WO 2021/140193   7/2021

OTHER PUBLICATIONS

R. Udaiyakumar, Dual Threshold Transistor Stacking (DTTS)—A Novel Technique for Static Power Reduction in Nanoscale Cmos Circuits, 2012. (Year: 2012).*
(Continued)

*Primary Examiner* — Khamdan N. Alrobaie
(74) *Attorney, Agent, or Firm* — Synergy IP Group AG; Natalie Albrecht

(57) ABSTRACT

A ferroelectric memory circuit (100) includes: a memory cell (102), wherein a memory state (102s) of the memory cell (102) is switchable between a first memory state and a second memory state, the memory cell (102) further configured to output an electrical current (101) in response to receiving a readout voltage (103); and a sense circuit (104) configured to output an output voltage (105) based on the result of integrating the electrical current (101) output by the memory cell (102), wherein the output voltage (105) represents whether the memory state (102s) is the first memory state or the second memory state.

15 Claims, 17 Drawing Sheets

(56) References Cited

U.S. PATENT DOCUMENTS

| | | | | |
|---|---|---|---|---|
| 9,312,000 | B1* | 4/2016 | Song | G11C 16/26 |
| 11,361,818 | B2* | 6/2022 | Katoch | G11C 11/412 |
| 2003/0021143 | A1* | 1/2003 | Nair | G11C 11/22 |
| | | | | 365/145 |
| 2005/0286333 | A1* | 12/2005 | Gupta | H03K 19/018521 |
| | | | | 365/226 |
| 2006/0250853 | A1* | 11/2006 | Taylor | G11C 11/5642 |
| | | | | 365/185.21 |
| 2008/0056024 | A1 | 3/2008 | Bollu | |
| 2016/0379703 | A1* | 12/2016 | Schwartz | G11C 11/2273 |
| | | | | 365/145 |
| 2023/0058423 | A1* | 2/2023 | Chevallier | G11C 13/0069 |

OTHER PUBLICATIONS

The International Searching Authority, "Search Report" in Application No. PCT/EP2021/050261, dated Mar. 22, 2021, 14 pages.

* cited by examiner

FIG. 16
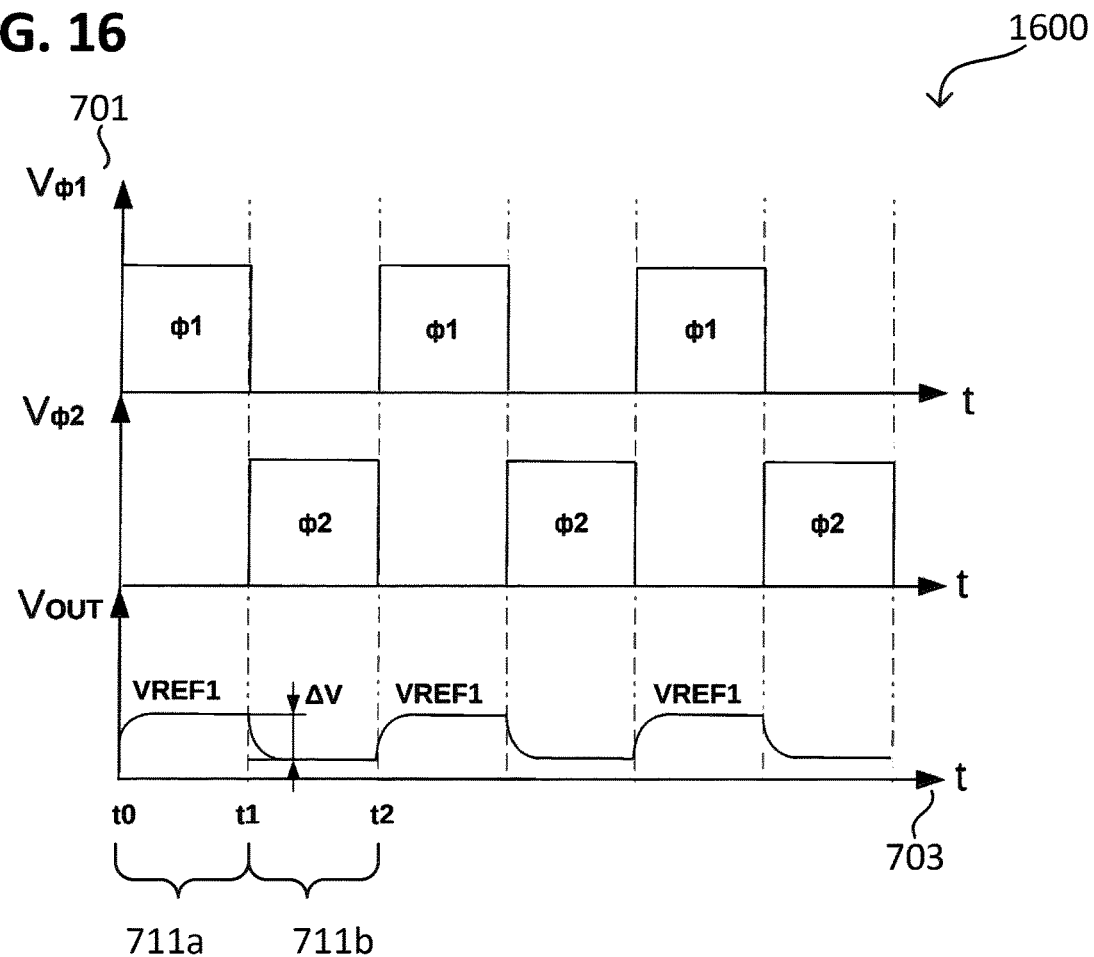
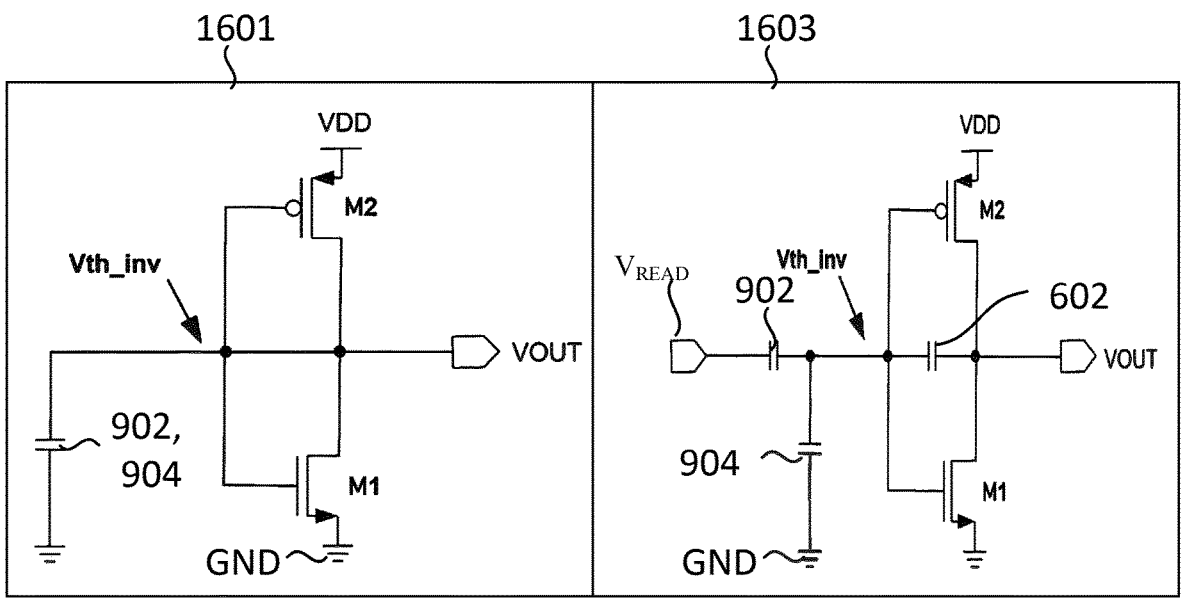

FERROELECTRIC MEMORY CIRCUIT AND READING METHOD THEREOF

This application is a U.S. National Stage Patent Application filed under 35 U.S.C. § 371 of International Patent Application No. PCT/EP2021/050261 filed Jan. 8, 2021, which claims priority to German Patent Application No. DE 10 2020 100 474.5, filed Jan. 10, 2020, the contents of which are herein incorporated by reference in their entirety and for all purposes.

RELATED APPLICATIONS

This application claims the benefit of German Patent Application No. 10 2020 100 474.5, filed Jan. 10, 2020, which is incorporated by reference herein in its entirety.

TECHNICAL FIELD

Various aspects relate to a memory cell circuit and methods thereof, e.g., a method for operating (e.g. reading out) a memory cell.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is changed, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g. for writing (e.g. programming and/or erasing) and/or reading the respective memory cell or groups of memory cells. Therefore, various driver schemes may be used to implement a desired addressing scheme for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 16 schematically shows an exemplary method for operating the memory cell circuit, according to various aspects.

DESCRIPTION

Figure 1:
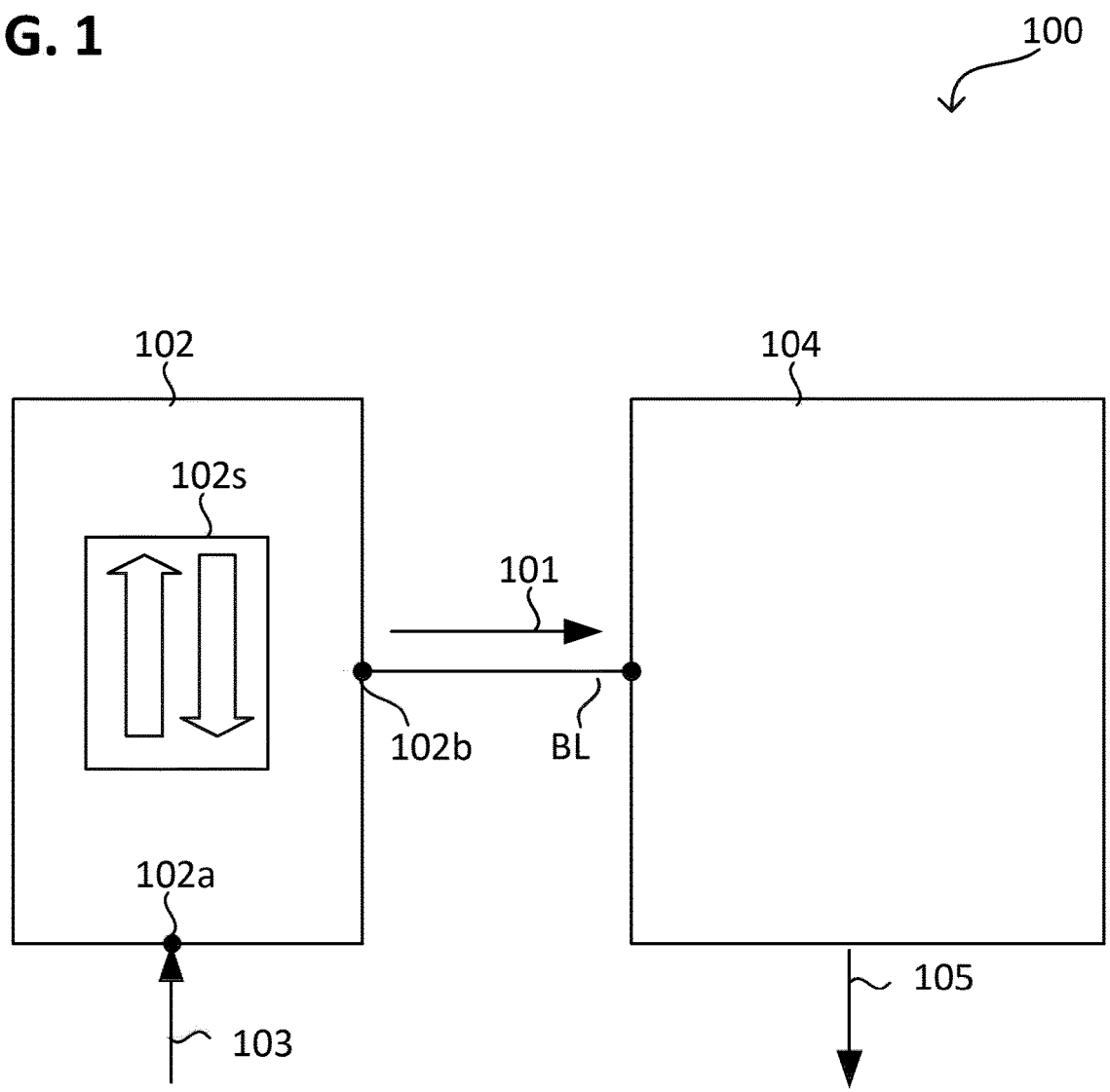
FIGS. 1 to 5 respectively schematically shows an exemplary configuration of a memory cell circuit, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g. arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

As used herein, the term "signal" may refer to a time dependent physical quantity, e.g., an electrical quantity (such as current or voltage). For example, the term "signal" may refer to an (e.g., time dependent) electrical current and/or an (e.g., time dependent) electrical voltage. A voltage as electrical signal may be time dependent (also referred to as voltage signal). A current as electrical signal may be time dependent (also referred to as current signal). Depending on the actual configuration, the signal may be processed (e.g., converted) by sensing the electrical current and/or an electrical voltage, or a consequence (residual effect) thereof, such as an electric or magnetic field.

The term "coupled" may be used herein to mean (physically and/or communicatively, e.g., electrically) connected, which may include a direct coupling or an indirect coupling. The term "coupled" or "connected" may be used herein with respect to nodes, terminals, circuit components, and the like, to mean (e.g., communicatively, e.g., electrically) connected, which may include a direct connection or an indirect connection, wherein an indirect connection may only include additional structures in the signal (e.g., current) path that do not influence the substantial functioning of the described circuit or device. For example, the term "coupled" or "connected" may refer with respect to nodes, terminals, circuit components and the like, to mean electrically conductively connected.

The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

In the following, reference is made to various circuit components processing and exchanging one or more signals with each other. For exchanging one or more signals, the circuit components may be communicatively coupled with each other, e.g., via an electrically conductive connection and/or via one or more terminals of the circuit components. For example, the one or more signals may be transmitted via an electrically conductive connection, within a circuit component and/or from circuit component to circuit component, e.g., from terminal to terminal. For example, the circuit components may each include respective terminals, which are coupled with each other. The one or more signals may be output via a terminal at the output side (also referred to as output terminal) of a circuit component and received via a terminal at the input side (also referred to as input terminal) of another circuit component.

The coupling (if present), e.g., an electrically conductive connection, may be represented, among others, in the following drawings by a line connecting two or more circuit components. For example, a terminal (if present) may be represented by the starting and end points of the line, e.g., emphasized by a node (dot), or indicated otherwise. It may be understood that other types of couplings may be used, if suitable. For example, the components may also be coupled capacitively and/or inductively with each other to exchange the one or more signals, if suitable. In the following, reference is made to exchanging one or more signals by terminals and electrically conductive connections. It may be understood, that the references made may be applied analogously to other types of couplings exchanging the one or more signals.

The term "voltage" may be used herein with respect to "a readout voltage", "a base voltage", "a reference voltage" "an input voltage", "an output voltage", "a supply voltage", "a word-line voltage", "a bit-line voltage" and the like. As an example, the term "base voltage" may be used herein to denote a reference voltage and/or a reference potential for an electrical circuit. With respect to an electrical circuit, the base voltage may be also referred to as ground voltage, ground potential, virtual ground voltage, or zero volts (0 V). The base voltage of an electrical circuit may be defined by the power supply that may be used to operate the electronic circuit. As another example, the term "source/drain voltage" may be used herein to denote a voltage that is provided to a source/drain node or a source/drain terminal of a transistor or a memory cell, as examples. As another example, the term "control-line voltage" may be used herein to denote a voltage that is provided to a control-line, e.g., of a memory cell arrangement (for example a "word-line voltage" may be provided to a "word-line", a "bit-line voltage", etc.).

Illustratively, a voltage provided to a node may assume any suitable value depending on the intended operation of the circuit including the node. A voltage provided to a node may be defined by the respective potential applied to that node relative to the base voltage (referred to as VB) of the circuit or another reference. Further, a voltage drop associated with two distinct nodes of a circuit may be defined by respective voltages/potentials applied at the two nodes.

In some aspects, two voltages may be compared with one another by relative terms such as "greater", "less", or "equal", for example. It is understood that, in some aspects, a comparison may include the sign (positive or negative) of the voltage value or, in other aspects, the absolute voltage values (also referred to as the magnitude) are considered for the comparison.

As used herein with respect to a signal (e.g., a voltage or a current), the term "pulse" refers to a (e.g., rapid and/or transient) change in the amplitude of the signal from a baseline value of the signal (e.g., being zero) to a higher or lower value, followed by a (e.g., rapid) return to the baseline value. The time dependency of the pulse may depend on the purpose and context of the pulse. For example, an analog signal may include a continuous change in the amplitude over time. For example, a digital signal may include a rapid change in the amplitude between multiple discrete values within a time interval, of which each value is maintained for longer than the time interval.

According to various aspects, the term "memory cell" may, for example, refer to a one-transistor-one-capacitor (1T1C) memory cell or a one-capacitor (1C) memory cell.

According to various aspects, a ferroelectric material may be used as part of a memory cell, e.g., as part of a ferroelectric capacitor (FeCap). The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various aspects may be related to a remanently-polarizable layer as memory layer or as a functional part of a memory cell, e.g., as part of a ferroelectric capacitor (FeCap). In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

In general, a memory cell arrangement (e.g. an array including a set of memory cells) may be operated based on one or more write operations (e.g. program and/or erase operations) and/or one or more readout operations. During a write operation, as example, predefined voltages may be applied at electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines.

In general, a memory cell arrangement may include a set of (e.g. volatile or non-volatile) memory cells, which may be accessed individually or in blocks, depending on the layout of the memory cell arrangement and/or the corresponding addressing scheme. For example, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g. to a word-line and to a bit-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture).

Various aspects are related to a memory cell arrangement including a plurality of memory cells (also referred to as set of memory cells). As an example, a control circuit (e.g., including an addressing circuit) may be configured to carry out and/or instruct one or more readout operations associated with a readout of one or more memory cells of the memory cell arrangement. In some aspects, a control circuit may be used to control a readout of a single memory cell of the memory cell arrangement that is intended to be read out, wherein the rest of the memory cells of the memory cell arrangement are not read out and not intended to be read out. For example, the control circuit may provide one or more control signals, as detailed in the following.

Various aspects are related to a memory cell circuit that is configured to carry out readout operations efficiently.

According to various aspects, a current integrator circuit may be used to read out one or more ferroelectric capacitors (FeCap) of one or more arrays of ferroelectric capacitors.

According to various aspects, a parasitic capacitance on a bit-line (BL) is reduced or eliminated. This enables to increase the number of circuit elements (e.g., memory cells) connected by the BL, e.g., without suffering from the increased parasitic capacitance (e.g., per memory cell). For example, a limitation of BL length, e.g., due to the capacitive ratio of the read-out to not read-out FeCaps, may be reduced or removed.

According to various aspects, a compensation mechanism may be applied to eliminate the dielectric current of the FeCap and only sense the switching charge.

According to various aspects, the sense circuit may be disposed below (regarding the layer stack of the integrated circuit) a FeCap array, such that the consumed area is minimized.

According to various aspects, a FeCap memory array may be read out by measuring the readout current (e.g., including the displacement current, e.g., including a dielectric current and/or a switching charge current), which is a response to the switching of the dipoles in the ferroelectric layer, when a voltage higher than the coercive voltage (as example for the switching voltage) is applied over the FeCap. The readout current is indicative, in which of the two memory states the ferroelectric material (e.g., programmed or erased) at the time of the readout.

For example, a memory cell (e.g., the FeCap) may generate a displacement current, which is output by the memory cell as readout current. The displacement current is proportional to the change of the electric displacement field D. The electric displacement field may be written as $D=\varepsilon_0 \cdot E + P$, wherein $\varepsilon_0$ is the permittivity of free space, E is the electric field intensity, and P is the polarization of the memory cell. Thus, a change in the polarization P contributes to the displacement current.

FIG. 1 illustrates schematically an exemplary configuration of a memory cell circuit 100, according to various aspects. The memory cell circuit 100 includes a memory cell 102 and a sense circuit 104.

A memory state (MS) 102s of the memory cell 102 (MC) may be switchable between a first memory state (MS1) and a second memory state 102s (MS2), that is, from MS1 to MS2 or from MS2 to MS1. Said otherwise, the memory cell 102 may be in a respective memory state of at least two memory states. For example, the memory cell 102 may be programmed (also referred to as programmed memory cell 102), such that the memory state 102s is the first MS. For example, the memory cell 102 may be erased (also referred to as erased memory cell 102), such that the memory state 102s is the second MS.

In case of a ferroelectric memory cell 102, the first memory state and a second memory state 102s may differ from each other in the polarity of the ferroelectric material of the memory cell 102 (e.g., its FeCap). For example, the polarity in the first memory state may be opposite polarity in the second memory state 102s. For example, switching the memory state of the memory cell 102 (also referred to as switching the memory cell 102) may, in case of a FeCap, include to flip the dipoles of the ferroelectric material of the FeCap to the opposite polarity.

According to various aspects, the memory state 102s may be non-transitory (e.g., remanent). For example, switching from the first memory state to the second memory state and back may have a hysteresis.

Throughout, reference is made to switching from the first memory state to the second memory state as an example for switching the memory cell 102, for demonstrative purposes, and is not intended to be limiting. The references made may analogously apply to switching from the second memory state to the first MS.

The memory cell 102 may be further configured to output an electrical current 101 (also referred to as readout current 101), e.g., by outputting an electrical current pulse 101 or another time dependent current (also referred to as current signal). The memory cell 102 may be further configured to output the readout current 101 in response to receiving a readout voltage 103 by the memory cell 102.

For example, the memory cell 102 may be configured to output the electrical current 101 in response to a change of the voltage applied to the memory cell 102 and/or in response to changing the memory state 102s of the memory cell 102 (also referred to as switching the memory state 102s). For example, applying the readout voltage 103 may include applying a voltage pulse to the memory cell 102, wherein the amplitude of the voltage pulse may be the readout voltage 103 or more.

The readout current 101 (e.g., the electrical current pulse) may be a function of the memory state 102s and/or the readout voltage 103. For example, the readout voltage 103 may be configured such, that the memory state 102s being MS1 is switched to MS2 in response to receiving the readout voltage 103. Additionally or alternatively, the readout voltage 103 may be configured such, that the memory state 102s being MS2 is maintained to be MS2 in response to receiving the readout voltage 103. In an example, the memory cell 102 may be configured such that switching the memory state 102s causes the memory cell 102 to release a certain amount of electric charge that generates the readout current 101.

The sense circuit 104 may be configured to output an output voltage 105 based on the readout current 101. The output voltage 105 may represent, whether the memory state 102s is MS1 or MS2 (at the time the readout voltage 103 is received). Said otherwise, the memory state 102s does not necessarily have to be the same before and after the memory cell 102 receives the readout voltage 103. Thus, as meant herein, the output voltage 105 representing the memory state 102s refers to the memory state 102s at the time, at which the memory cell 102 receives the readout voltage 103. For example, the output voltage 105 may by greater in the case, when the memory state 102s is MS1, than in the case, when the memory state 102s is MS2, or vice versa.

The memory cell 102 may, for example, include a first terminal 102a (also referred to as input terminal 102a) to receive the readout voltage 103. The memory cell 102 may, for example, include a second terminal 102b (also referred to as output terminal 102a) to output the readout current 101, e.g., the electrical current pulse 101.

Figure 2:
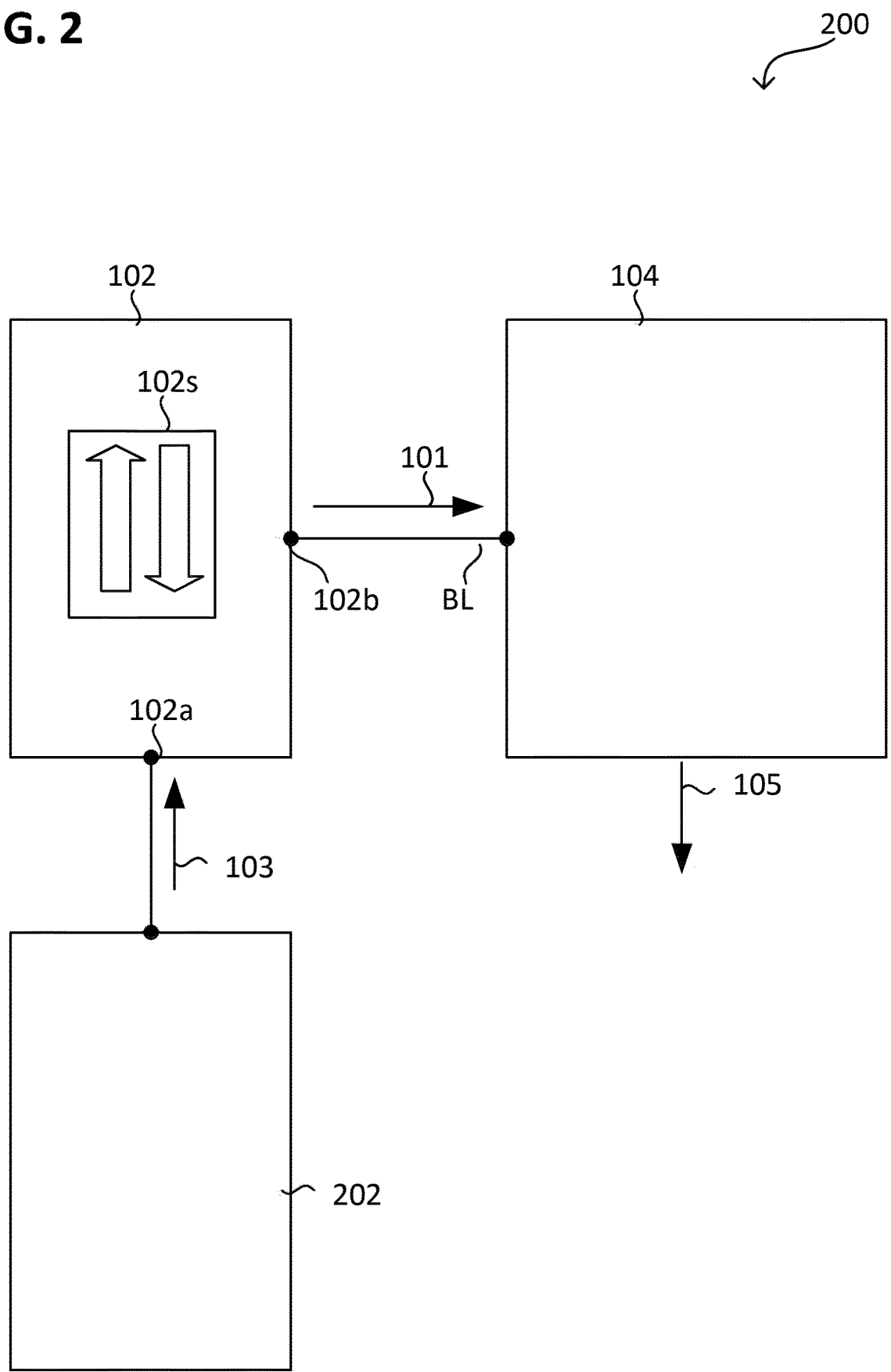

FIG. 2 illustrates schematically an exemplary configuration of a memory cell circuit 100, according to various aspects 200, in which the memory cell circuit 100 further includes a supply circuit 202. The supply circuit 202 may be configured to apply the readout voltage 103 to the memory cell 102. For example, the supply circuit 202 may be configured to generate the readout voltage 103 and/or fed the readout voltage 103 to the memory cell 102 in response to receiving a readout instruction. For example, the supply circuit 202 may be configured to output the readout voltage 103 only during a read-out time interval.

It may be understood that the sense circuit 104 and the supply circuit 202 may be implemented as separate circuits or implemented by a common circuit that implements the functions of both, the sense circuit 104 and the supply circuit 202.

Figure 3:
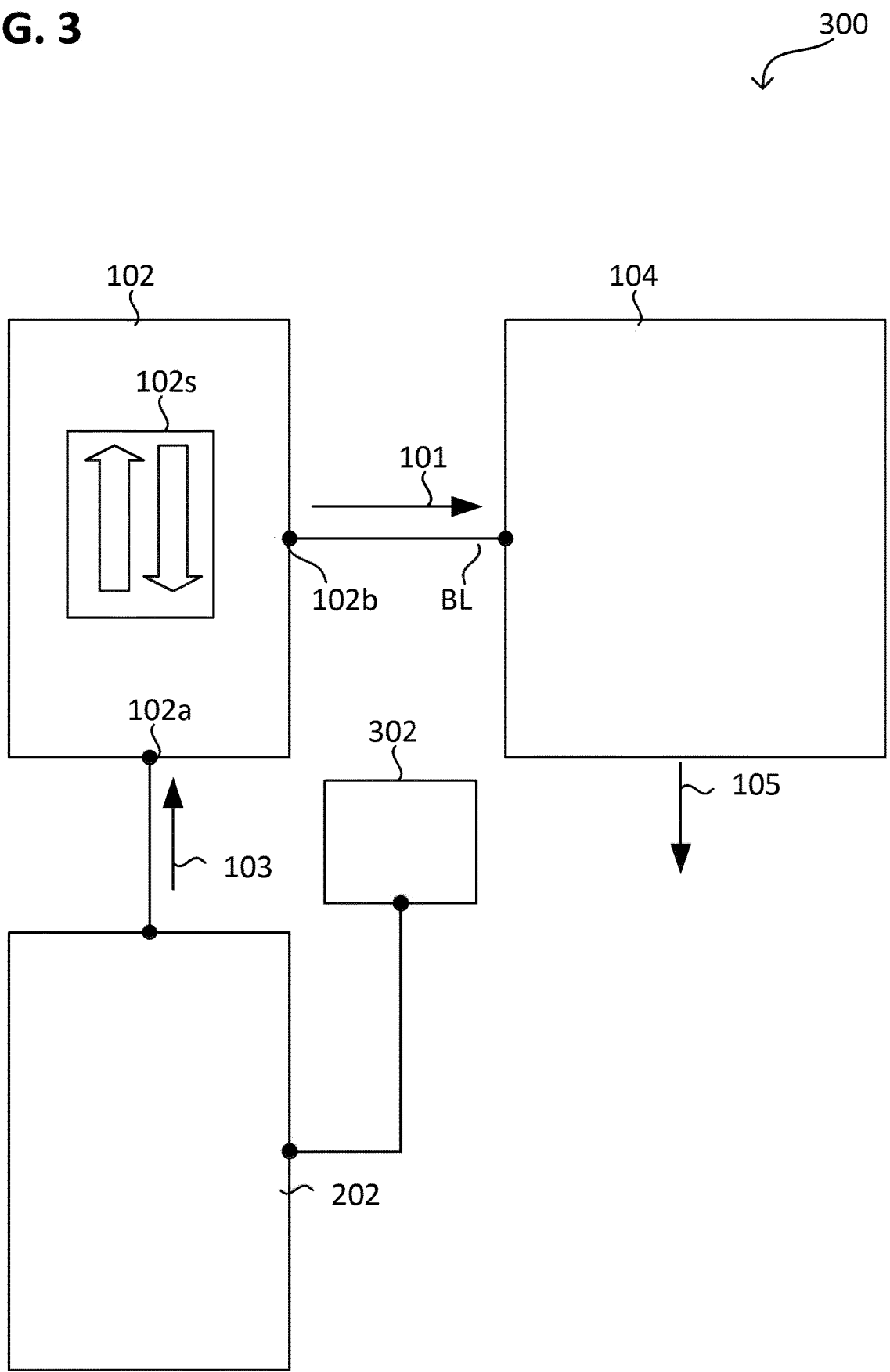

FIG. 3 illustrates schematically an exemplary configuration of a memory cell circuit 100, according to various aspects 300, in which the memory cell circuit 100 further includes a timing circuit 302 (also referred to as controller) configured to provide one or more control signals representing the read-out time interval, e.g., various phases thereof. The or each control signal may be transmitted to various components of the memory cell circuit 100, for example, to coordinate a readout operation during the read-out time interval. For example, the control signal may be high (or low) during the read-out time interval. Exemplarily, the timing circuit 302 may include a clock generator or the like to generate the control signal.

It may be understood that the timing circuit 302 may be implemented as separate circuit or may be implemented as part of the sense circuit 104 and/or the supply circuit 202.

Figure 4:
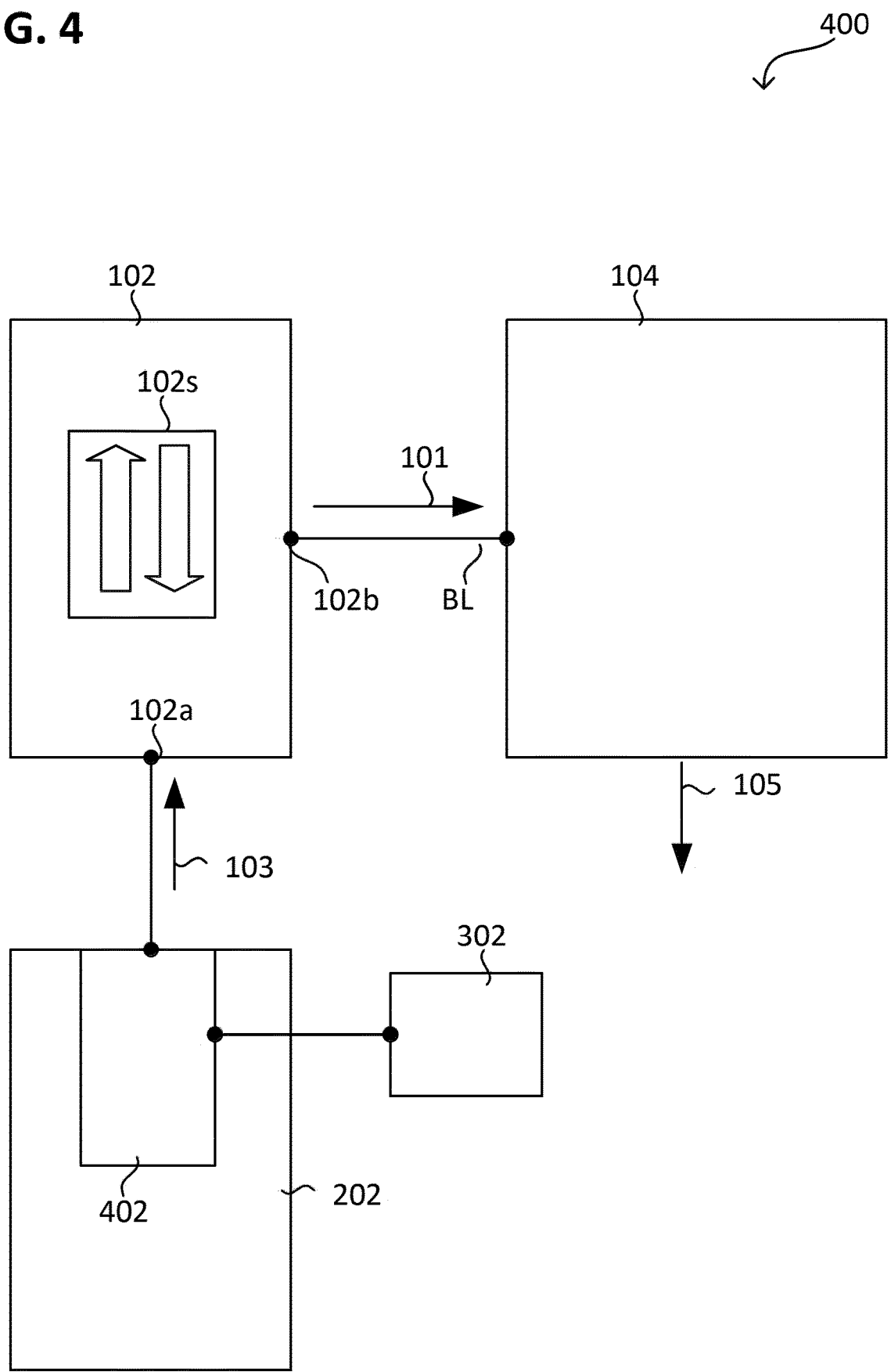

FIG. 4 illustrates schematically an exemplary configuration of a memory cell circuit 100, according to various aspects 400, in which the memory cell circuit 100 further includes an addressing circuit 402, e.g., if the memory cell circuit 100 includes multiple memory cells 102. Each of the memory cell 102 may be addressable by the addressing circuit 402.

The addressing circuit 402 may be part of the supply circuit 202 or coupled between the supply circuit 202 and each memory cell 102. For example, the addressing circuit 402 may include multiple control lines for transmitting the readout voltage 103.

The addressing circuit 402 may be configured to direct the readout voltage 103 to the memory cell 102 that is addressed (that is, the memory cell 102 to be read out). For example, multiple memory cells 102 (if present) may be addressed serially, e.g., one after each other. In this case, the multiple memory cells 102 may receive the readout voltage 103 serially. It may be understood that the references made herein to a single memory cell 102, may analogously apply the each of the multiple memory cells 102 (if present) serially. For example, each memory cell 102 may be assigned to a read-out time interval, wherein the readout voltage 103 is applied to the memory cell 102, during the read-out time interval as assigned to the memory cell 102. In this case, the read-out operation may initiate a sequence of multiple read-out time intervals, of which each is assigned to one of the multiple memory cells 102.

In the following, various implementations of the components of the memory cell circuit 100 are explained in more detail. Throughout, reference is made to a ferroelectric capacitor (also referred to as FeCap or $C_{FE}$) as exemplary component of the memory cell 102 (in this case also referred to as FeCap memory cell 102), for demonstrative purposes, and is not intended to be limiting. The references made to the ferroelectric capacitor may analogously apply to other types of MCs 102, e.g., including a remanently polarizable portion, e.g., a remanently-polarizable layer.

It may be understood that the addressing circuit 402 may be implemented as separate circuit or may be implemented as part of the supply circuit 202 and/or the supply circuit 202. For example, the addressing circuit 402 may include one or more select transistors (e.g., implementing a switch) coupled in series in a current path between the memory cell 102 and the sense circuit 104. This enables to select the memory cell 102 to which the readout voltage 103 is applied. Additionally or alternatively, the addressing circuit 402 may include a select transistor (e.g., implementing a switch) coupled in series in a current path between the memory cell 102 and the supply circuit 202. This enables to select the memory cell 102 from which the readout current 101 is processed.

Figure 5:
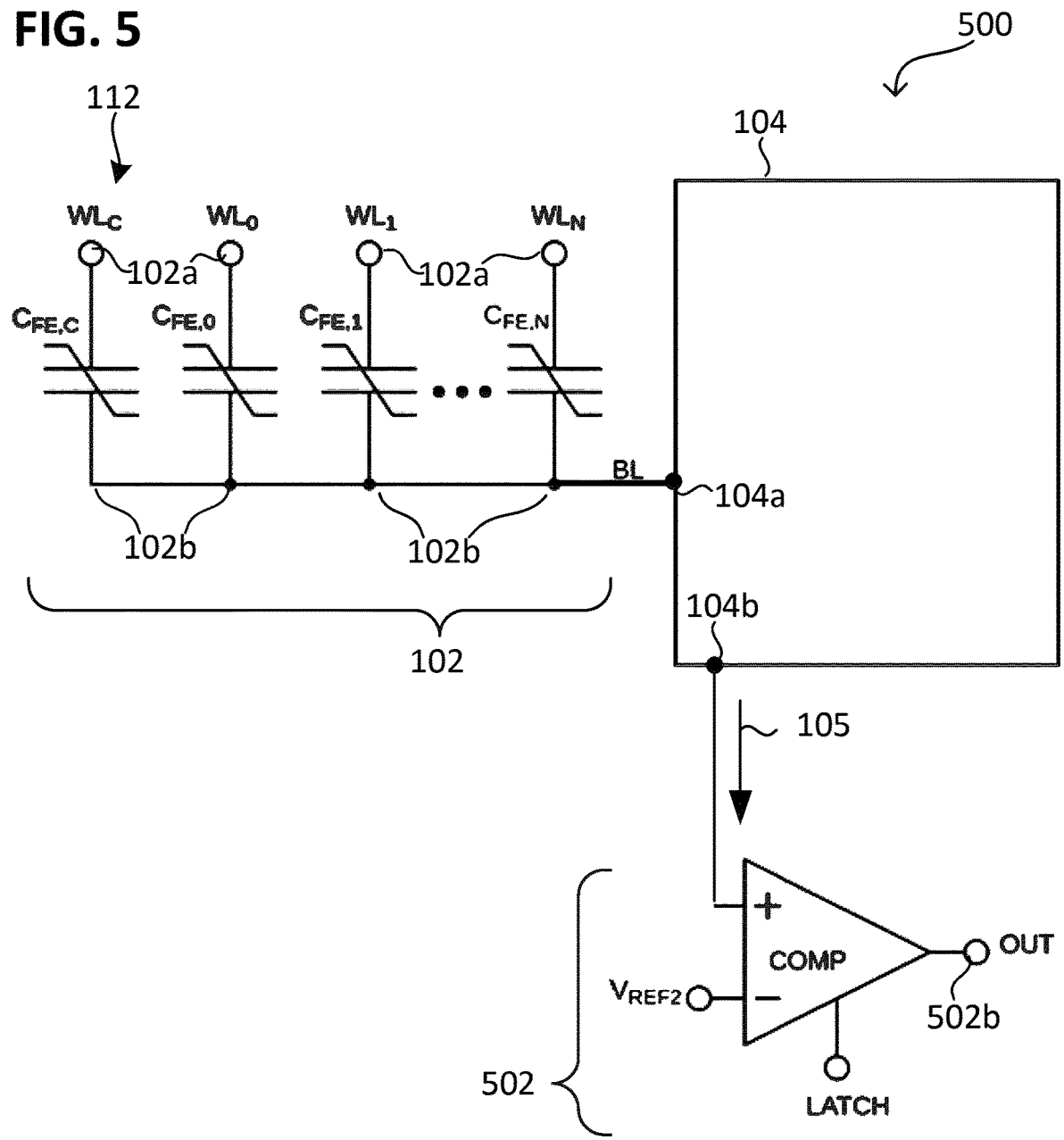

FIG. 5 illustrates schematically an exemplary configuration of a memory cell circuit 100, according to various aspects 500, which includes multiple memory cells 102 (also referred to as a set of memory cells 102). The multiple memory cells 102 may include one or more (e.g., a number of M=N or a number of M=N+1) memory cells 102, of which each memory cell 102 includes a FeCap ($C_{FE,0}, \ldots, C_{FE,N}$). Optionally, one memory cell 102 of the multiple memory cells 102 may be configured to as dummy memory cell 112 (dummy memory cell 112), which includes a FeCap ($C_{FE,C}$), as outlined in detail later.

The input terminals 102a of each memory cell 102 may be coupled to a respective control line of multiple first control lines ($WL_C, WL_0, \ldots, WL_N$). The multiple first control lines (also referred to as word-lines) may couple each of the multiple MCs 102 with the supply circuit 202 and/or the addressing circuit 402. The output terminals 102b of each memory cell 102 may be coupled by a second control line (also referred to as bit-line) to the sense circuit 104. For example, multiple ferroelectric capacitors (FeCaps) may be coupled to a single bit-line (BL).

The bit-line (BL) may be coupled to an input terminal 104a of the sense circuit 104. The sense circuit 104 may further include an output terminal 104b to output the output voltage 105.

Optionally, the memory cell circuit 100 may include multiple sets of memory cells 102, of which each set is coupled by a respective bit-line (BL) of the multiple bit-lines to the sense circuit 104. In this case, one or more decoders may be configured to multiplex the multiple bit-lines to the input terminal 104a of the sense circuit 104.

The memory cell circuit 100 may further include an analog-to-digital converter (ADC) 502. The ADC 502 may be configured to convert the output voltage 105 into a digital representative (OUT) of the memory state 102s. The digital representative may include a digital signal.

The digital signal, e.g., the digital representative, may include to a time-discrete and/or value-discrete signal. For example, the digital signal may vary between two or more value-discrete amplitude values. Accordingly, an analog signal, e.g., the output voltage 105, may include a time-continuous and/or value-continuous signal.

An ADC 502 may be configured to digitalize an analog signal fed to the ADC 502, e.g., the output voltage 105 ($V_{INT}$). For example, the ADC 502 may include two analog input terminals (+ and −) and one binary digital output terminal 502b.

As illustrated, reference is made to a comparator (COMP) as exemplary implementation of the ADC 502, for demonstrative purposes, and is not intended to be limiting. The references made to the comparator may analogously apply to other types of ADC 502, e.g., including a digital signal processor or the like. For example, the comparator 502 may include an operational amplifier (op-amp), a buffer, and/or an inverter.

The comparator may be configured to output a digital signal (OUT) indicating whether the output voltage 105 is larger than at least one reference voltage ($V_{REF2}$) or whether the output voltage 105 is less than the at least one reference voltage ($V_{REF2}$). For example, the comparator may be configured to receive the output voltage 105 from the sense circuit 104 and to compare the output voltage 105 with the at least one reference voltage ($V_{REF2}$). Further, the comparator 502 may be configured to provide the digital representative based on a result of the comparison.

Optionally, the comparator may be a latched comparator. The latched comparator may include an additional input terminal (LATCH). The latched comparator may include a clocked (or dynamic) comparator structure. The respective latch terminal (LATCH) of the comparator may enable to only strobe the comparator at certain intervals, which achieves a higher accuracy and lower power. For example, the latched comparator may be set in a reference state (also referred to as comparator reset) before conducting the comparison. The reference state may be independent from the state of the latched comparator before the reset.

In the following, exemplarily implementations of the sense circuit 104 are explained in more detail, for demonstrative purposes, and is not intended to be limiting.

Figure 6:
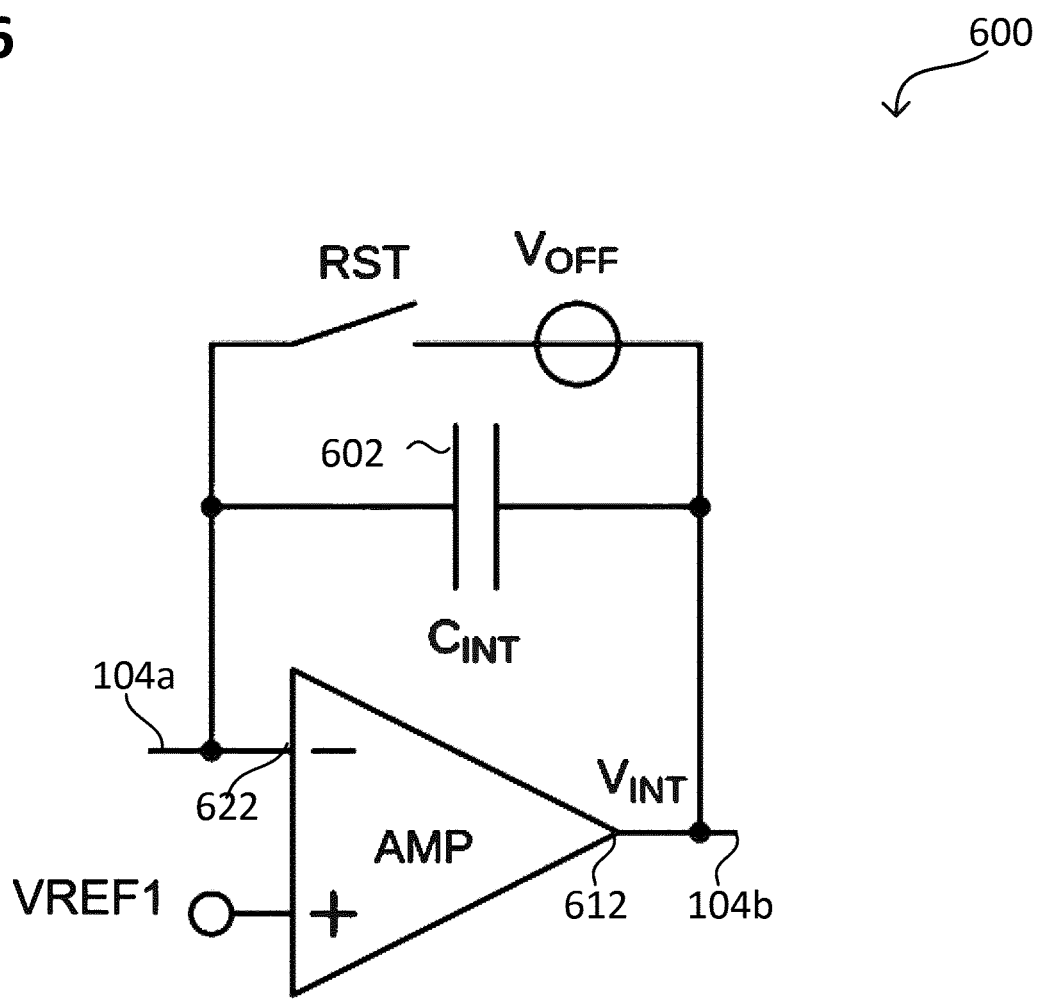
FIG. 6 schematically shows an exemplary configuration of a sense circuit, according to various aspects.

FIG. 6 illustrates schematically an exemplary configuration of a sense circuit 104, according to various aspects 600, which includes an amplifier (AMP), e.g., an op-amp, and at least one circuit element 602 including a capacitance $C_{INT}$ (also referred to as sensing capacitance). It may be understood that circuit elements of various types may be used to provide the capacitance Cur, e.g., such as one or more capacitors. In the following, reference is made to a capacitor 602 as example for the at least one circuit element 602, for demonstrative purposes, and is not intended to be limiting. The references made to the capacitor 602 may analogously apply to various types or numbers of circuit elements 602 providing the sensing capacitance $C_{INT}$.

The AMP may include two input terminals (+ and −) and one output terminal 612. The output terminal 612 of the AMP may be coupled to or provide the output terminal 104 of the sense circuit 104. A first input terminal (−) of the AMP may be coupled to or provide the input terminal 104 of the sense circuit 104. A second input terminal (+) of the AMP may be coupled to at least one reference voltage ($V_{REF1}$). The AMP may be configured to amplify a signal received at the first input terminal (−) of the AMP and to output the amplified signal via the output terminal 612 of the AMP.

Further, the sense circuit 104 may include at least one controlled switch (RST). In general, a controlled switch (also referred to as RST or RST switch) may be implemented by one or more transistors or the like. The RST may be controlled by control signal $\phi_{RST}$ (also referred to as RST control signal). The RST may be coupled in parallel to the capacitor 602. The RST may be configured to be switchable between two switching states, of which a first switching state brings the capacitor 602 into a first state (also referred to as resetting the capacitor 602). The first state (also referred to as reference state) of the capacitor 602 may be independent from the state of the capacitor 602 before the reset. For example, the first switching state may bypass the capacitor 602 and/or electrically couple the input terminal 104a with the output terminal 104b.

In general, resetting the capacitor 602 may include charging or discharging the capacitor 602. For example, as result of resetting the capacitor 602, a charge of the capacitor 602 may be a reference charge (e.g., substantially zero). It may be understood that, when suitable, the reference charge may also differ from zero.

In a second switching state of the two switching states of the RST, the reset (e.g., bypass) may be released. For example, the second switching state may allow the capacitor 602 to be charged, e.g., by the readout current 101 received at the input terminal 104a. For example, the input terminal 104a and the output terminal 104b may be galvanically isolated from each other (e.g., when both terminals are at the same voltage) by bringing the RST in the second switching state.

In the following, reference is made to the RST being closed in the first switching state and opened in the second switching state as an example, for demonstrative purposes, and is not intended to be limiting. The references made to the RST may analogously apply to another configuration of the RST providing for the described operational function.

The RST may be controlled in accordance with the read-out time interval and/or by the timing circuit 302. For example, RST may be in the second switching state during the read-out time interval and/or in the first switching state between two read-out time intervals.

The capacitor 602 may be coupled in parallel to the AMP. For example, the capacitor 602 may be coupled between the first input terminal (−) of the AMP and output terminal 612 of the AMP, thus providing a feedback path of the AMP. Additionally or alternatively, the RST may be coupled in parallel to the AMP. For example, the RST may be coupled between the first input terminal (−) of the AMP and output terminal 612 of the AMP, thus providing a feedback path of the AMP.

Further, each of the RST, the capacitor 602, and the AMP may be coupled between the input terminal 104a of the sense circuit 104 and the output terminal 104b of the sense circuit 104.

Optionally, the output terminal 104a may be coupled to an output offset voltage ($V_{OFF}$). For example, $V_{OFF}$ may differ from the base voltage.

The operation of the sense circuit 104 according to various aspects 600 is explained in the following.

When the readout current 101 is received at the input terminal 104a, the RST is the opened. Thus, the capacitor 602 is charged by the readout current 101. As result of the charging, a charge (also referred to as readout charge) of the capacitor may differ from the reference charge. For example, the readout charge may be more than the reference charge. The value of the readout charge may be a function of the amount of charge carried by the readout current 101, that is, by the current-voltage characteristic of the readout current 101.

As result of the charging, a voltage difference is generated over the capacitor 602, which is sensed as signal by the AMP. The AMP may amplify the signal received by the sense circuit 104 and output the amplified signal $V_{INT}$ via the output terminal 612 of the AMP. For example, the amplified signal $V_{INT}$ may be output as output voltage 105.

In an illustrative example, the electric charge released by the memory cell 102 in response to receiving the readout voltage 103 is collected by the capacitor 602. The AMP provides a charge amplifier, thereby implementing a current integrator. The current integrator may be configured to convert the readout current 101 into the output voltage 105 by (also referred to as current-to-voltage conversion) based on an integration of the readout current 101. In other words, the output voltage 105 output by the current integrator represents the time integral of the readout current 101. The current integrator accumulates the electrical charge as quantity of the readout current 101 over a defined time (also referred to as current integration) to provide the output voltage 105 representing the accumulated electrical charge.

In the following, reference is made to the AMP as exemplary voltage-to-voltage converting component of the current integrator for demonstrative purposes, and is not intended to be limiting. The references made to the AMP may analogously apply to another implementation of the voltage-to-voltage converting component (also referred to as voltage-to-voltage converter) configured to convert the charge of the capacitor 602 into the readout voltage 103.

Figure 7:
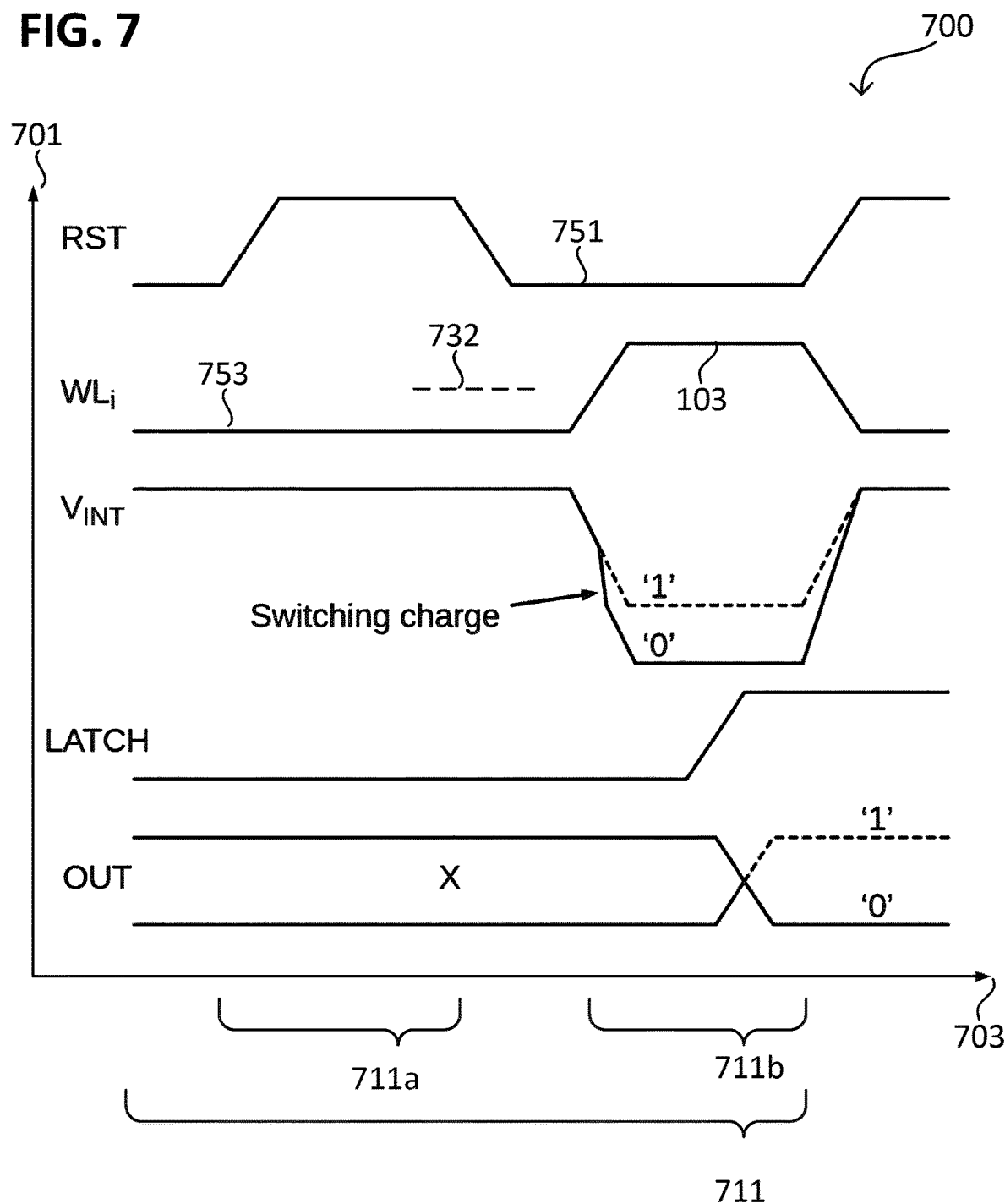
FIGS. 7 and 8 respectively schematically show an exemplary method for operating the memory cell circuit, according to various aspects.

FIG. 7 illustrates schematically a method 700 for operating the memory cell circuit 100, according to various aspects, in a diagram, in which a signal quantity 701 is illustrated over the time 703 during a read-out time interval 711. The signal quantity 701 may refer to a time dependent current or a time dependent voltage, depending on the context.

The RST (e.g., its switching state) may be controlled by a control signal 751 applied to RST. The method 700 is described for the respective memory cell 102 assigned to the read-out time interval 711 (also referred to as addressed memory cell 102). In other words, during the read-out time interval 711, the memory cell 102 assigned to the read-out time interval 711 may be read out. Analogously, multiple MCs 102 may be read out serially during a respective of multiple serial read-out time intervals 711.

In a first phase 711a of the read-out time interval 111, the RST is closed. For example, the RST control signal 751 ($\phi_{RST}$) may be "high" in the first phase 711 to close the RST. In response to the closed RST, the capacitor 602 is reset. As further response to the closed RST, e.g., due to negative feedback configuration of the sense circuit 104 (e.g., providing a virtual short by capacitor 602), the bit-line (BL) may be set to $V_{REF1}$.

In the first phase 711a, the voltage 753 of the i-th word-line ($WL_i$) is set to a value below the switching voltage 732 of the i-th memory cell 102. For example, the voltage 753 of each of the multiple word-lines ($WL_C$, $WL_0$, ..., $WL_N$) may be set to the value below the switching voltage 732 of the memory cell 102. As result, the FeCap of each memory cell 102 is not switched in the first phase 711a. Illustratively, each memory cell 102 does not receive a voltage higher than its switching voltage 732.

In a second phase 711b of the read-out time interval 111, the RST is opened. For example, the RST control signal 751 ($\phi_{RST}$) may be "low" in the second phase 711 to open the RST. In response to the opened RST, the reset of capacitor 602 is released. As further response to the closed RST, the APM is set into a configuration providing the current integrator. The virtual short between $V_{REF1}$ and BL is maintained in the second phase 711b (illustratively, due to the negative feedback with capacitor 602).

Subsequent to opening the RST, the memory cell 102 assigned to the read-out time interval 711 is provided with the readout voltage 103. For example, a voltage 753 (also referred to as word-line voltage) of the respective i-th word-line ($WL_i$) coupled to the addressed i-th memory cell 102 may be set to the readout voltage 103, e.g., regarding the voltage of bit-line (also referred to as bit-line voltage). For example, the word-line voltage is increased until the switching voltage of the addressed memory cell 102 (e.g., its FeCap) is reached (e.g., crossed). The voltage difference between the word-line voltage and the bit-line voltage may be the readout voltage 103.

As result, the memory cell 102 (e.g., its FeCap) generates the readout current 101. The readout current 101 may be a function of the memory state 102s of the memory cell 102 at the point of time, the memory cell 102 receives the readout voltage 103 (also referred to as read-out the memory state 102s). Said otherwise, the current-time characteristic of the readout current 101 may be a function of the read-out memory state 102s. Generally, the readout current 101 may include one or more current components overlapping each other. For example, a first current component (also referred to as switching charge current) of the readout current 101 may be the current generated as response to a change of the memory state 102s. For example, the switching charge current may be generated, when the read-out memory state 102s is switched in response to receiving the readout voltage 103 (also referred to as destructive reading). In the case of the FeCap, a second component of the readout current 101 may include a dielectric current of the FeCap.

The dielectric current may, for example, be substantially independent from the read-out memory state 102s. Thus, when the memory state 102s of the FeCap is destructively read, the readout current 101 may include the switching charge current (also referred to as switching current) and the dielectric current. The dielectric may result from the dielectric contribution of a memory cell 102.

The readout current 101 is integrated by the capacitor 602 (also referred to as current integration). In response thereto, $V_{INT}$ decreases.

If the addressed memory cell 102 (e.g., its FeCap) is a programmed memory cell 102 (that is, the memory state 102s is the first memory state), the difference between the word-line voltage (VWL) and the bit-line voltage (VBL) is more than the switching voltage ($V_{switch}$) of the memory cell 102. Said otherwise, VWL−VBL>$V_{switch}$. In response, only the dielectric current may be output as readout current 101 (represented by dashed line '1') and integrated by the current integrator. For example, the memory cell 102 may be programmed before the read-out time interval 711.

If the addressed memory cell 102 (e.g., its FeCap) is an erased memory cell 102 (that is, the memory state 102s is the second memory state), the difference between the bit-line voltage and the word-line voltage is more than the switching voltage of the memory cell 102. Said otherwise, VBL−VWL>$V_{switch}$. In response, the dielectric current and the switching charge current may be output as readout current 101 (represented by dashed line '0') and integrated by the current integrator. For example, the memory cell 102 may be erased before the read-out time interval 711.

According to various aspects, the switching charge current may be generated as response to switching the memory state 102s of the memory cell 102 (e.g., its FeCap). Illustratively, switching the memory state 102s of the FeCap may include changing (e.g., reversing) the electrical polarization of the FeCap. In response thereto, the FeCap may release an electrical charge (also referred to as switching charge), which may be output as switching charge current. The dielectric current may be a response of the FeCap independent from switching the memory state 102s.

As response to the current integration, the comparator may be latched to output the binary output signal (OUT). For example, the binary output signal may have one of only two states (also referred to as 0 or 1 in this example).

Figure 8:
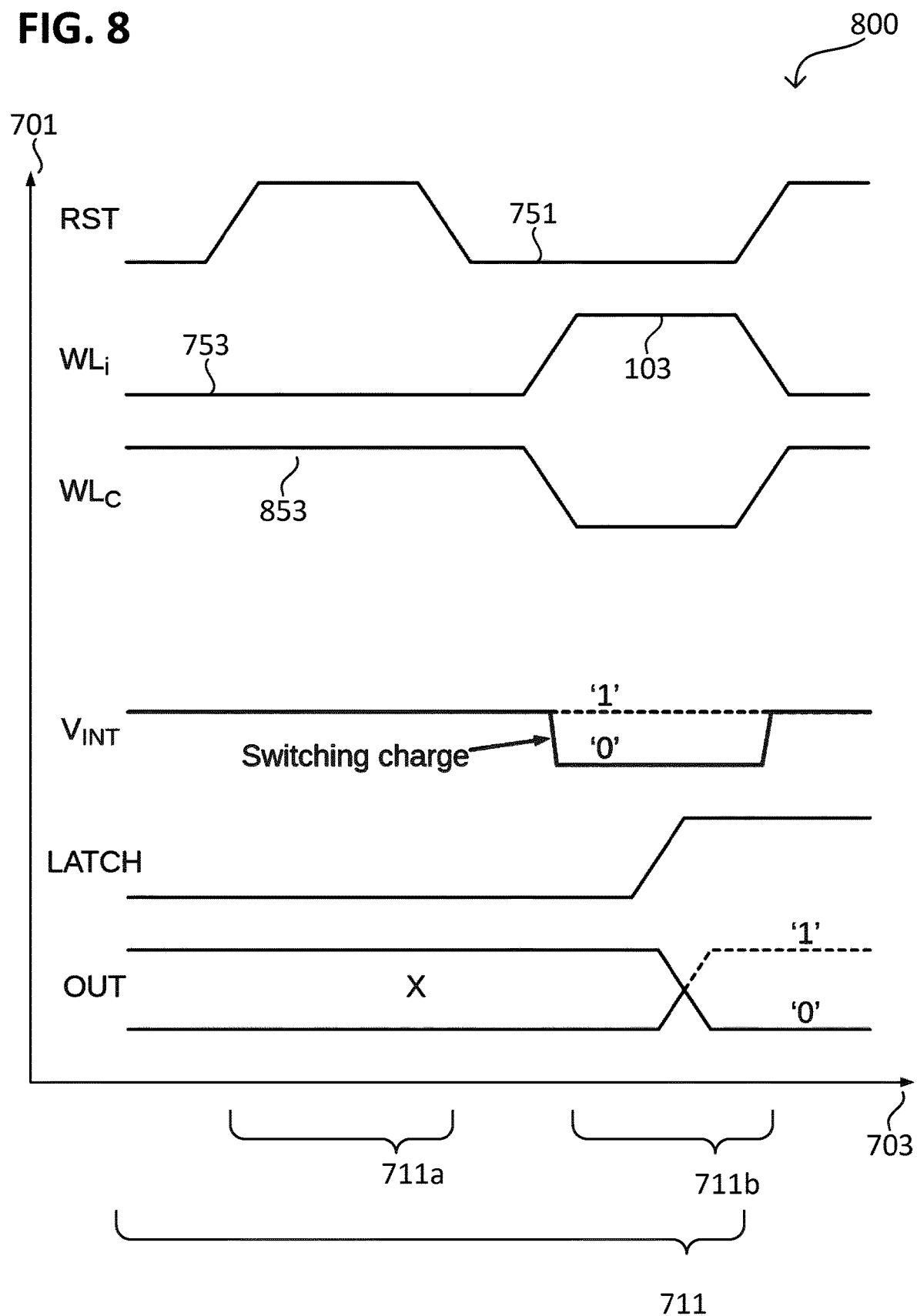

FIG. 8 illustrates schematically a method 700 for operating the memory cell circuit 100, according to various aspects 800, in a diagram, which uses the dummy memory cell 112. Using one of the multiple memory cells 102 as dummy memory cell 112 enables to at least partially compensate the readout voltage 103, e.g., to compensate the dielectric current. For example, the dummy memory cell 112 may include or be formed from a FeCap memory cell, e.g., similar to the addressed FeCap memory cell 102.

As the dielectric current (if present) is also integrated, the output voltage 105 is a function on the absolute value of the internal capacitance of the addressed FeCap memory cell 102, e.g., the capacitance of the FeCap. As result therefrom, the dynamic range of the output voltage of the AMP may be reduced.

Compensating the dielectric current may increase the dynamic range of the AMP. For example, if the dielectric current is integrated, too, the capability (e.g., voltage headroom) left to integrate the switching charge current may be reduced. Illustratively, when the contribution of the dielectric current is large, e.g., in the worst case, the output of the AMP may be already clipped. Compensating the dielectric current reduces such a risk and increases the capability to integrate the switching charge current.

In the second phase, the word-line voltage 753 supplied to the addressed memory cell 102 may be set to the readout voltage 103. Further (e.g., substantially simultaneously), the word-line voltage 853 supplied to the dummy memory cell 112 may be set to a polarity (also referred to as dummy voltage) that is opposite to the readout voltage 103, e.g., to the reversed readout voltage 103. Said otherwise, the polarity of the dummy voltage and the readout voltage 103 may be opposite (regarding the bit-line voltage as reference). For example, the dummy voltage and the readout voltage may be in a push-pull-configuration (that is, two push-pulled voltages are provided). For example, the FeCap memory cell 102 and the dummy memory cell 112 may be read out by two push-pulled readout voltages 103.

The supply circuit 202 may be configured to supply the addressed FeCap memory cell 102 with the readout voltage 103, and simultaneously, supply the dummy memory cell 112 with the dummy voltage. For example, the supply circuit 202 may include a push-pull generator that provides the readout voltage 103 and the dummy voltage. For example, the push-pull generator may include an inverter that converts the readout voltage 103 into the dummy voltage.

As result, the dummy memory cell 112 and the addressed FeCap memory cell 102 output each a dielectric current with opposite polarities (e.g., flow direction). For example, the dummy memory cell 112 outputs a negative dielectric current and the FeCap memory cell 102 outputs a positive dielectric current or vice versa.

Both dielectric currents, of which one is output by the dummy memory cell 112 and which one is output by the FeCap memory cell 102, are output to the bit-line (BL). As result, the dielectric currents partially or completely compensate each other, that is, they partially or completely cancel out each other. This achieves that the dielectric current of the readout current 101 is at least partially removed by the dummy memory cell 112.

This achieves that the integration of the dielectric current of the FeCap memory cell 102 can be avoided by applying an opposite voltage sweep to the world line ($WL_C$) coupled to the dummy memory cell 112 (also referred to as cancellation word-line).

As detailed above, the dummy voltage and the readout voltage 103 may be applied simultaneously, resulting in overlapping output currents of the dummy memory cell 112 and the memory cell 102. It may be understood, that the dummy voltage and the readout voltage 103 may be also applied after each other, e.g., if the current integrator is operated in a clocked manner. For example, the APM may only amplify the result of charging the capacitor 602 successively by the output currents of the dummy memory cell 112 and the memory cell 102 (one after the other). Illustratively, the current integrator may suspend the amplification until the capacitor 602 is charged by both, the output current of the dummy memory cell 112 and the output current of memory cell 102. This facilitates the timing.

The dummy memory cell 112 (e.g., its FeCap) can be programmed before the read-out time interval 711. As result, the memory state 102s of the dummy memory cell 112 is maintained during the read-out time interval 711, e.g., independently from the polarity of the dummy voltage. As result, the dummy memory cell 112 does not output a switching charge current.

In an illustrative example, a negative current is supplied to the bit-line as response to the voltage change at the cancellation word-line ($WL_C$), wherein the negative current has the same absolute value as the dielectric current that is supplied to the bit-line in response to the voltage change at the respective i-th word-line ($WL_i$) coupled to the addressed i-th memory cell 102. Therefore, only the switching charge current (if present) output by the addressed memory cell 102 is integrated.

In the following, further exemplarily implementations of the components of the memory cell circuit 100 are explained in more detail.

Figure 9:
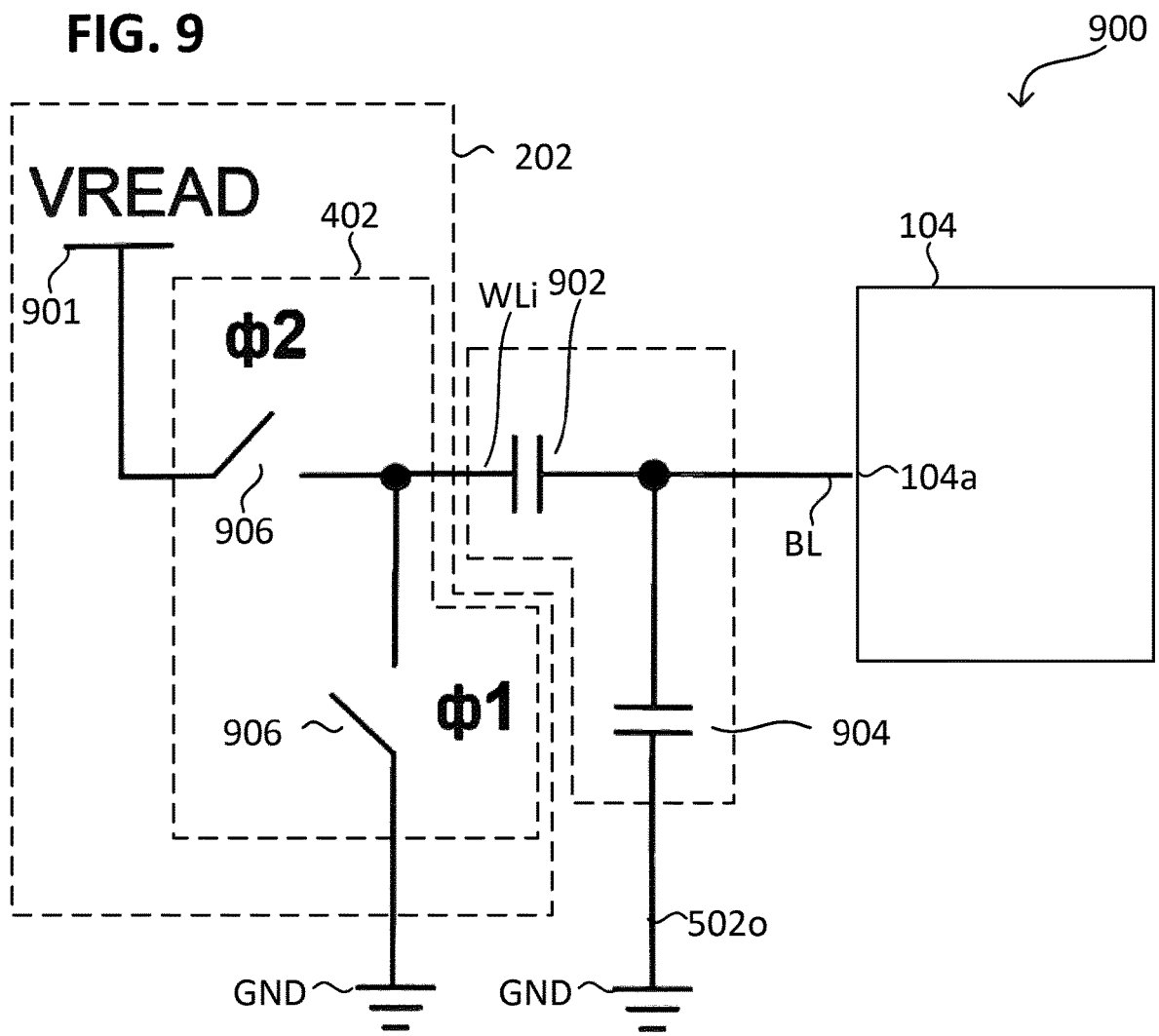
FIG. 9 schematically shows an exemplary configuration of a memory cell circuit, according to various aspects.

FIG. 9 illustrates schematically an exemplary configuration of a memory cell circuit 100, according to various aspects 900. The supply circuit 202 is configured to provide the readout voltage 103 (VREAD) at a node 901 of the supply circuit 202 (also referred to as supply node). The memory cell circuit 100 may include multiple memory cells 102, of which one memory cell 102 is addressed (also referred to as memory cell 902) and one or more memory cell 102 are not addressed (also referred to as memory cell 904).

The addressing circuit 402 may be configured to (e.g., galvanically) couple the addressed memory cell 902 to the supply node 901 and to (e.g., galvanically) isolate the not addressed memory cell 904 from the supply node 901. For example, the i-th memory cell 102 may be addressed, and thus, coupled to the supply node 901 by the i-th word-line ($WL_i$), also referred to as addressed word-line ($WL_i$). For example, the other word-lines ($WL_C$, $WL_0$, ..., $WL_{i-1}$, $WL_{i+1}$, $WL_N$) may be (e.g., galvanically) coupled to a base reference voltage, which is exemplarily represented by ground (GND).

In the depicted example, the addressing circuit 402 includes multiple switches 906 to provide the functionality of addressing. The multiple switches 906 may be controlled by control signals ϕ1 and ϕ2. It may be understood that the multiple switches 906 and their operation by control signals ϕ1 and ϕ2 may be an exemplarily representative for various implementations of the functionality of addressing and are for demonstrative purposes, not intended to be limiting. For example, the functionality of addressing may be also provided by a multiplexer or a logic gate or equivalents thereof. Additionally or alternatively, the functionality of addressing may be also provided by clocked readout voltage signals or equivalents thereof, that provide a pulsed readout voltage similar to the control signals ϕ1 and ϕ2.

Figure 10:
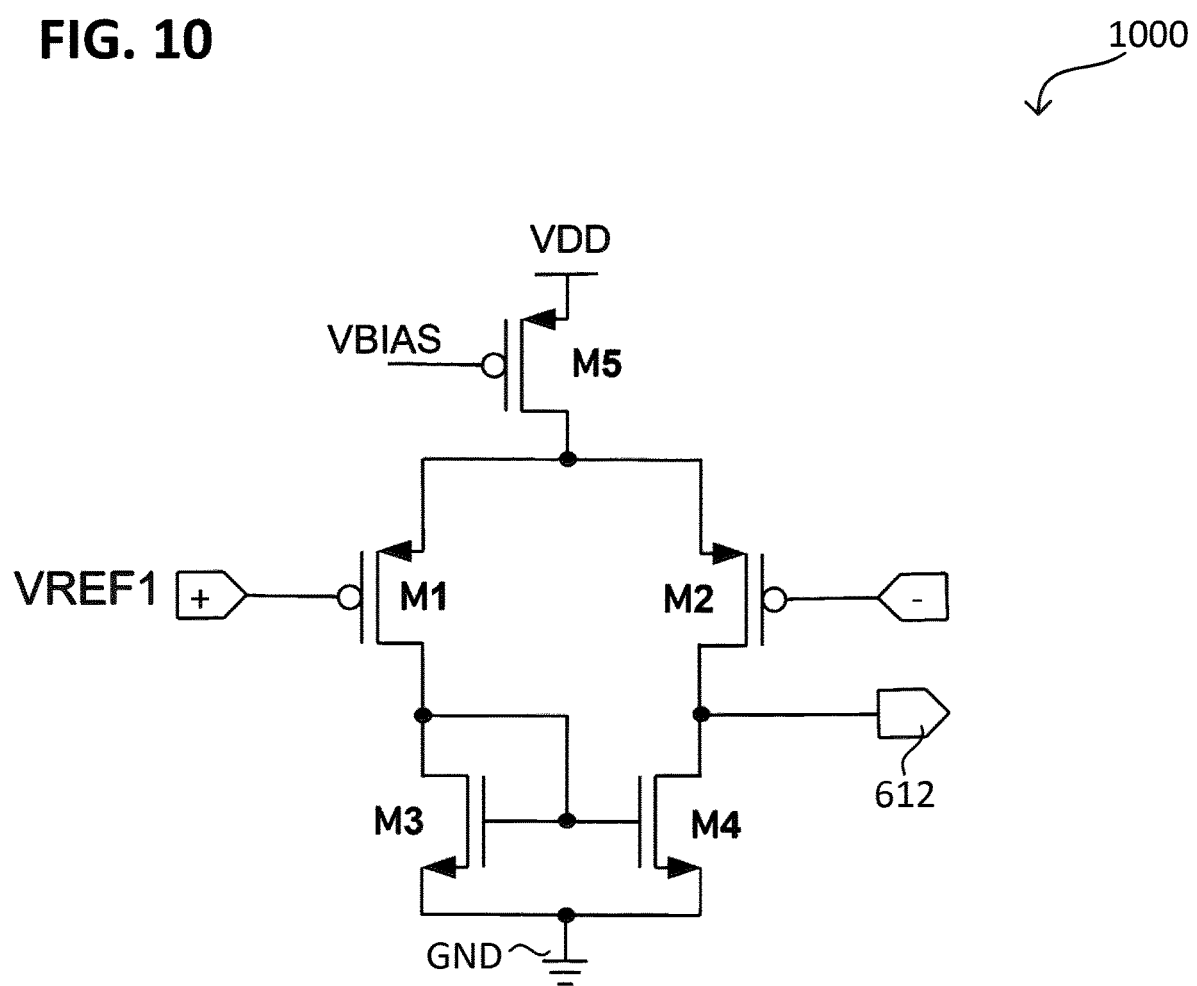
FIG. 10 schematically shows an exemplary configuration of an amplifier, according to various aspects.

FIG. 10 illustrates schematically an exemplary configuration of an AMP, according to various aspects 1000, in which the AMP includes or is formed from an op-amp. The readout current 101 may be converted to a voltage by a charge amplifier configuration utilizing the op-amp as a gain providing element. The op-amp may include two input terminals (+ and −) and an output terminal 612. Further, the op-amp may be connected to a supply voltage (VDD) and base reference voltage, which is exemplarily represented by ground (GND). The operation of the memory cell circuit 100 including the AMP according to aspects 1000 implementing the current integrator is described in the following.

Figure 11:
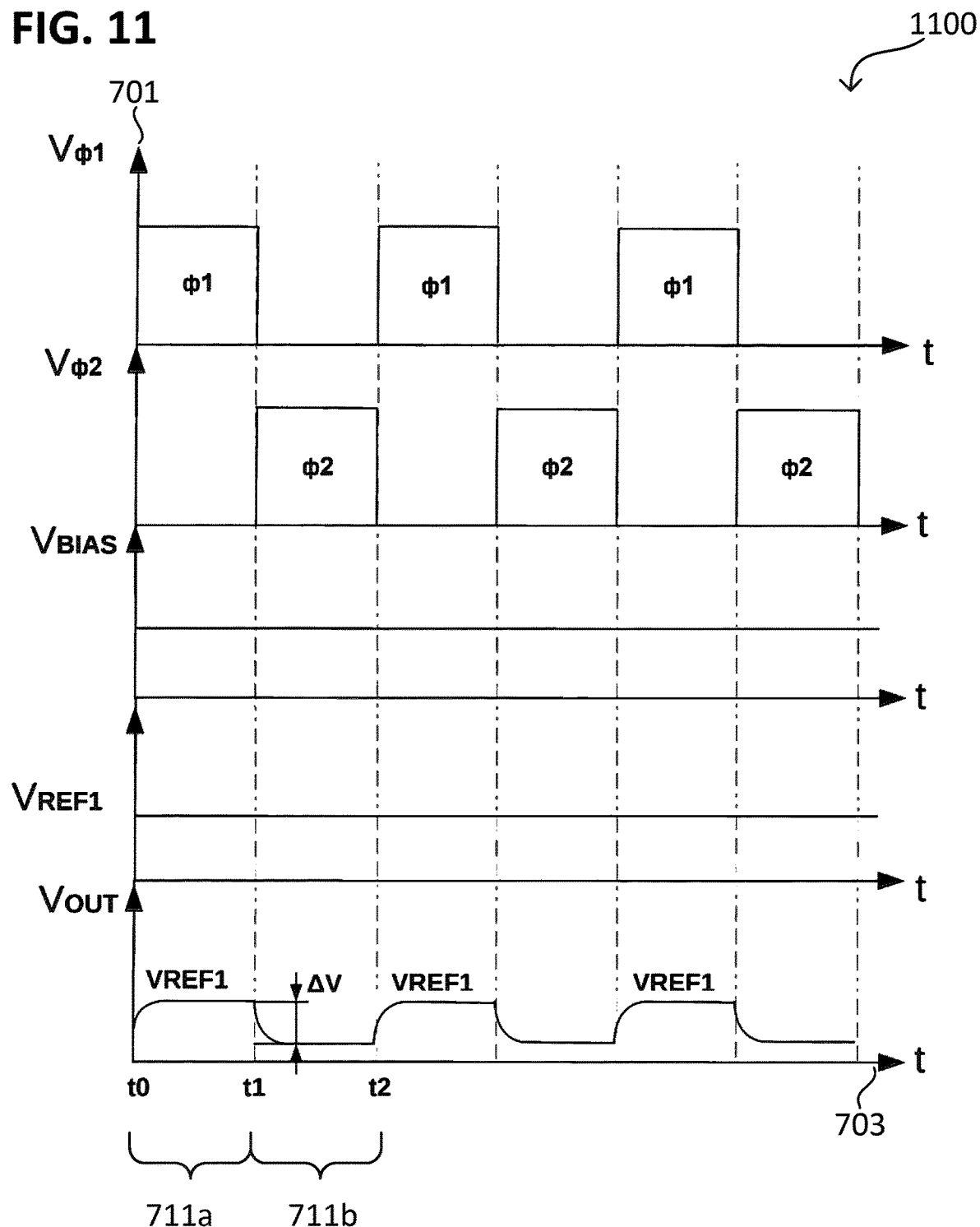
FIG. 11 schematically shows an exemplary method for operating the memory cell circuit, according to various aspects.

FIG. 11 illustrates schematically a method 700 for operating the memory cell circuit 100, according to various aspects 1100, in a diagram, in which a signal quantity 701 is illustrated over the time 703 during a read-out time interval 711. The sense circuit 104 according to various aspects 1100 may include the AMP according to aspects 1000, which implements a current integrator, as described previously.

The AMP may be biased by two bias voltages ($V_{REF1}$, $V_{BIAS}$). $V_{BIAS}$ is configured to bias the current mirror transistor M5. $V_{REF1}$ is configured to keep output transistor M4 in saturation.

In the first phase 711a between t0 and t1, one or more switches 906 controlled by the voltage ($V_{\phi1}$) of control signal ϕ1 are closed, and one or more switches 906 controlled by the voltage ($V_{\phi2}$) of control signal ϕ2 are opened. As response thereto, the capacitor 602 is reset (e.g., discharged) and the voltage ($V_{OUT}$) of the output terminal 612 of the AMP is $V_{REF1}$.

In the second phase 711b between t1 and t2, one or more switches 906 controlled by control signal ϕ2 are closed, and one or more switches 906 controlled by control signal ϕ1 are opened. As response, the readout current 101 output by the addressed memory cell 902 (e.g., its FeCap) is integrated by capacitor 602, which generates a voltage ΔV at the output terminal 104b of the sense circuit 104.

In this configuration, $V_{REF1}$ may be in the middle of the supply voltage in order to achieve a high open loop gain. However, this may result in higher voltage requirements for the readout voltage 103 ($V_{READ}$), that is, the voltage needed to switch the addressed memory cell 902 (e.g., to flip the dipoles in the ferroelectric material of the FeCap to the opposite memory state 102s).

In this configuration, the input differential pair (M1 and M2) may be enlarged in order to achieve a high open loop gain. However, this may result in a high parasitic input capacitance, thus lowering the total charge flowing into capacitor 602. Illustratively, the current is split between capacitor 602 and the FeCap of the one or more not addressed memory cells 904.

In this configuration, $V_{BIAS}$ and the readout voltage 103 ($V_{READ}$) are used to bias the OTA into the proper operating region. Both voltages may require area inefficient biasing circuits to provide the respective voltage.

In cases, the supply voltage is below 1 Volt (e.g., for switched capacitor integrators in submicron technologies), the open loop gain may be insufficient, and a reduction of input/output common mode voltages and accuracy of the biasing currents may occur. For example, this may occur when the op-amp is an operational transconductance amplifier (OTA).

Also, if the current integrator is used to read out one or more FeCaps (ferroelectric) memory arrays, the total circuit (e.g., silicon) area may be of great importance. Thus, the memory cell circuit 100 may be desired to be as small as possible.

To avoid the above insufficient open loop gain and reduction of input/output common mode voltages and accuracy of the biasing currents, an inverter may be used additionally or alternatively to the AMP as described in the following.

Figure 12:
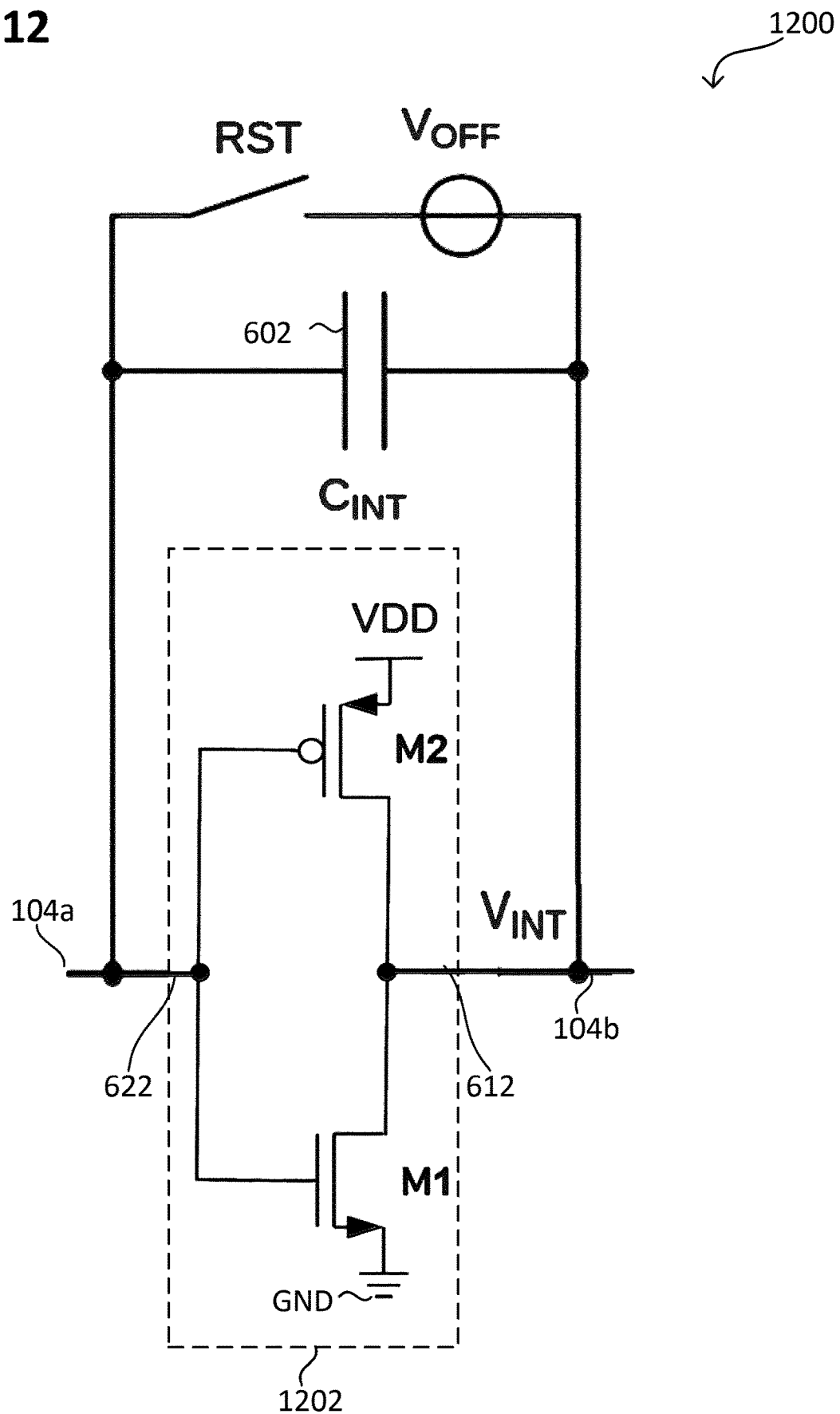
FIG. 12 schematically shows an exemplary configuration of a sense circuit, according to various aspects.

FIG. 12 illustrates schematically an exemplary configuration of a sense circuit 104, according to various aspects 1200, which includes an inverter 1202 and the capacitor 602 including the sensing capacitance $C_{INT}$. For example, alternatively to the APM, the inverter 1202 may be used to implement the current integrator. This approach reduces the voltage requirements, reduces the parasitic input capacitances, and reduces the circuit area compared to the AMP.

The inverter 1202 may include two transistors M1, M2, the gates of which are coupled with each other and with the input terminal 622 of the inverter 1202. The input terminal 622 of the inverter 1202 may be coupled to or provide the input terminal 104a of the sense circuit 104. Further, the two transistors M1, M2 may be connected in series between the supply voltage (VDD) and the base reference voltage, which is exemplarily represented by ground (GND).

For example, the inverter 1202 may include an inverter 1202 provided by CMOS (complementary metal-oxide-semiconductor) technology (also referred to as CMOS inverter). CMOS technology is a type of MOSFET (metal-oxide-semiconductor field-effect transistor) technology, also referred to as complementary MOSFET. CMOS technology uses complementary and symmetrical pairs of p-type and n-type MOSFET (here M1 and M2) for logic operations. The CMOS inverter may be a type of a NOT-logic gate.

The inverter 1202 may enable to provide a 100% negative feedback loop as detailed in the following.

Figure 13:
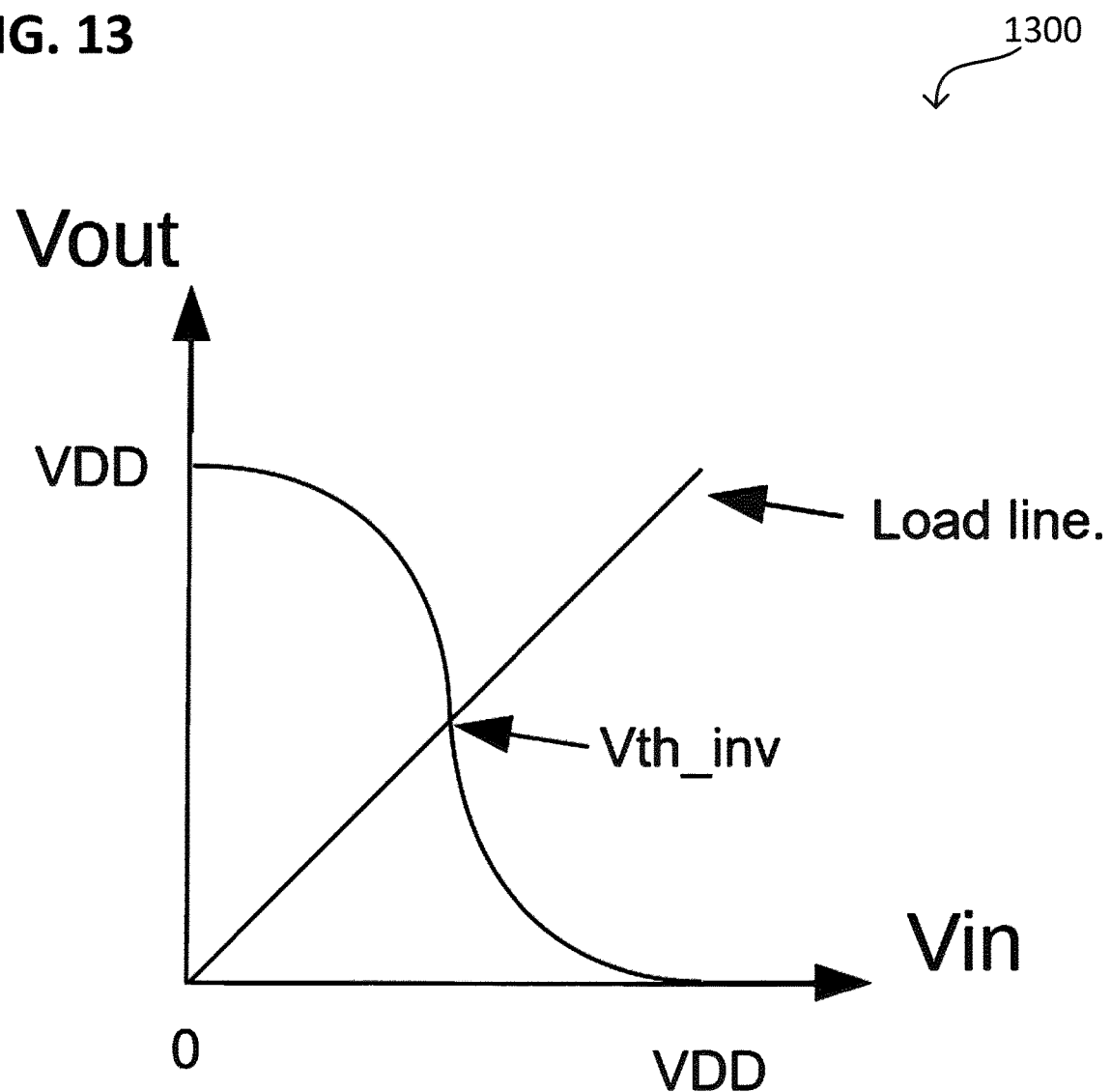
FIG. 13 schematically shows an exemplary method for operating the memory cell circuit, according to various aspects.

FIG. 13 illustrates schematically a method 700 for operating the memory cell circuit 100, according to various aspects 1300, in a diagram, in which the voltage ($V_{OUT}$) of the output terminal 612 of the inverter 1202 is illustrated over the voltage ($V_{IN}$) of the input terminal 622 of the inverter 1202. As the input side and the output side of the inverter 1202 are connected to each other, e.g., by RST and/or the capacitor 602, the sense circuit 104 automatically biases itself to its threshold voltage (Vth_inv).

Figure 14:
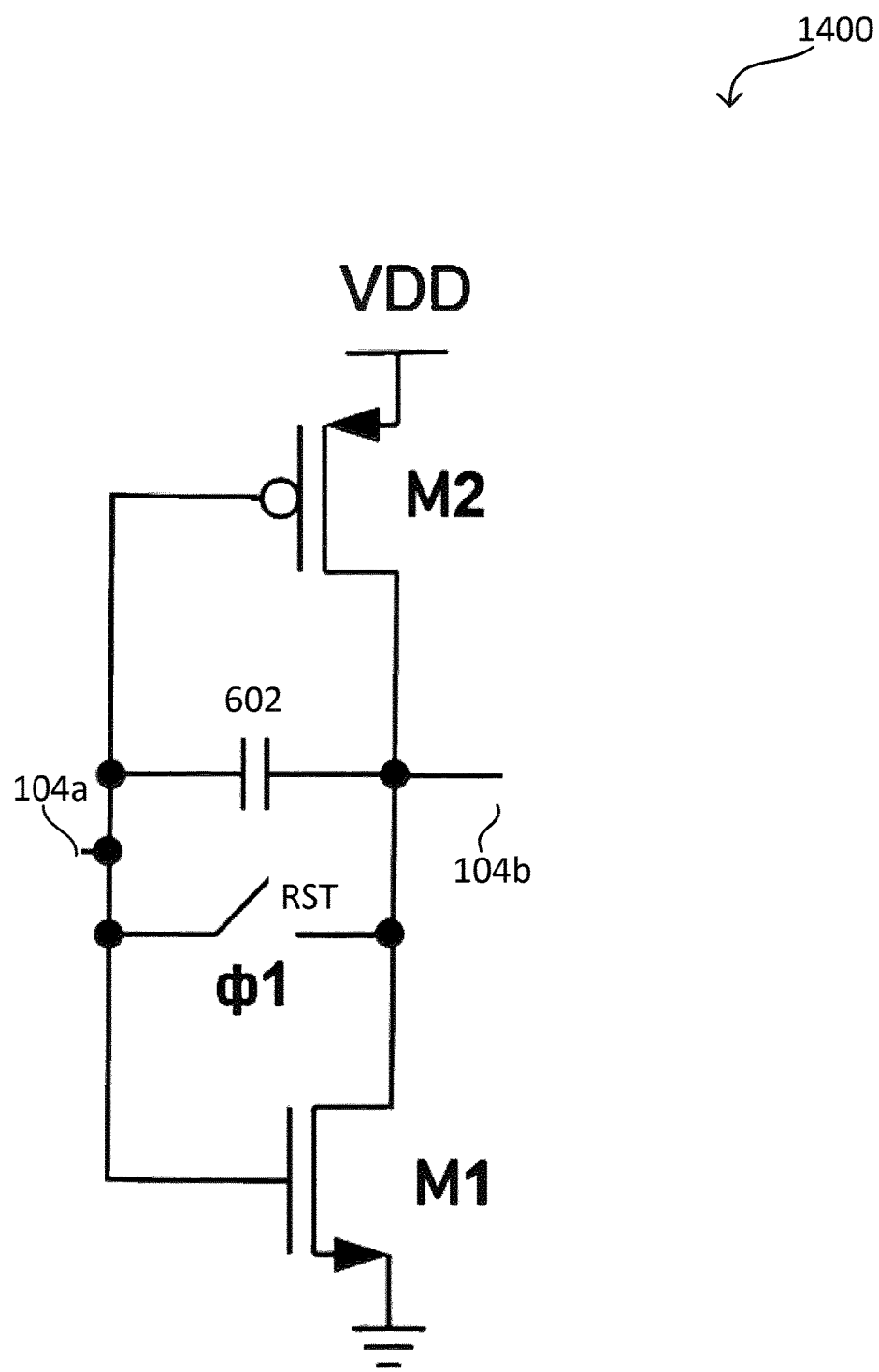
FIGS. 14 and 15 respectively schematically show an exemplary configuration of a sense circuit, according to various aspects.

FIG. 14 illustrates schematically an exemplary configuration of a sense circuit 104, according to various aspects 1400, which includes the inverter 1202 and the capacitor 602 including the sensing capacitance $C_{INT}$. As illustrated, the RST may be controlled by control signal ϕ1.

Figure 15:
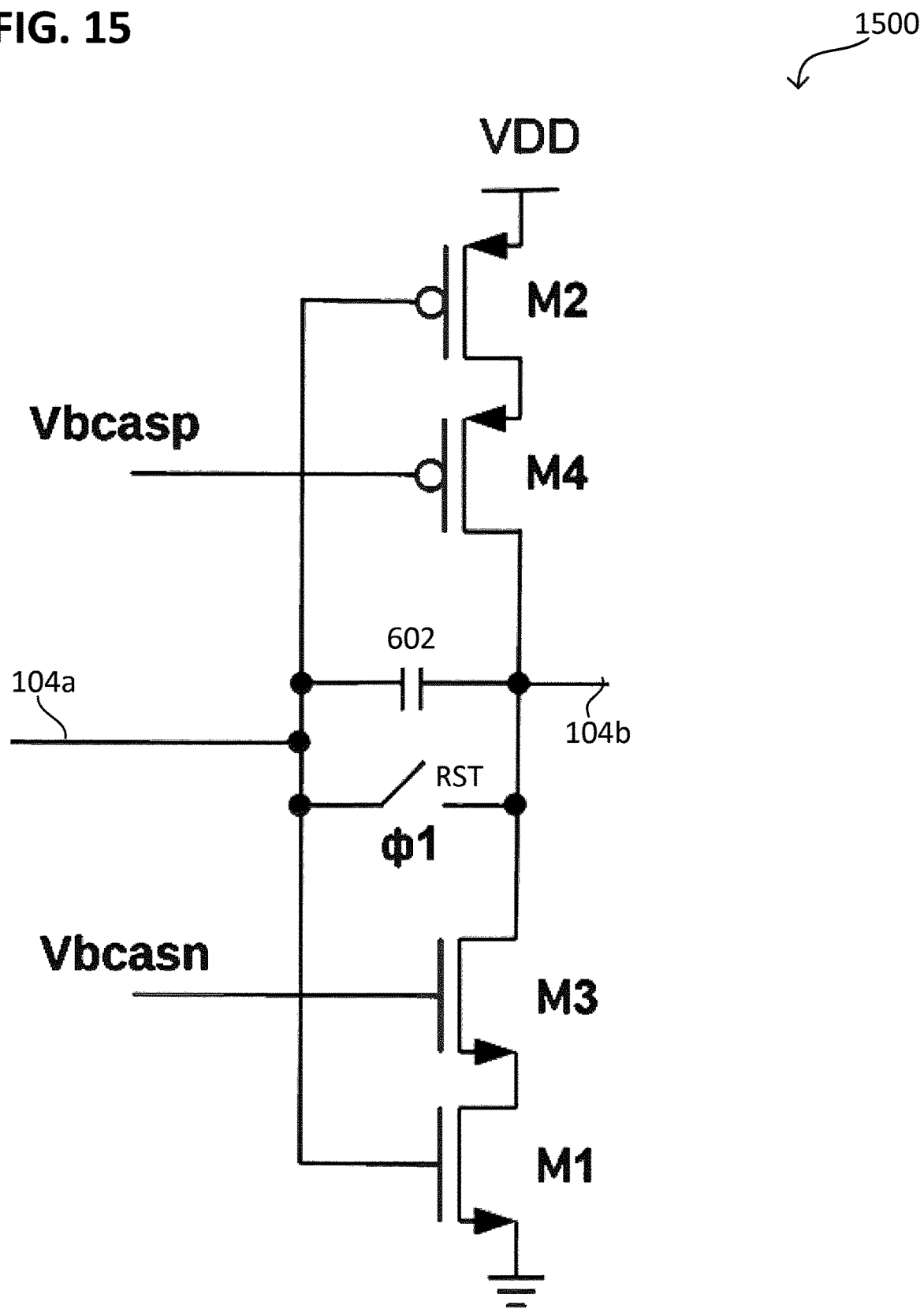

FIG. 15 illustrates schematically an exemplary configuration of a sense circuit 104, according to various aspects 1500, which includes the inverter 1202. The inverter 1202 may include cascode transistors M3, M4. Using cascode transistors M3, M4 may enable to provide a high open loop gain. Each of the cascode transistors M3, M4 may be controlled by a respective control signal, here referred to as Vbcasp and Vbcasn (e.g. positive and negative Vbcas).

FIG. 16 illustrates schematically a method 700 for operating the memory cell circuit 100, according to various aspects 1600, in a diagram, in which a signal quantity 701 is illustrated over the time 703 during a read-out time interval 711. The sense circuit 104 according to various aspects 1600 may include the inverter 1202, which implements the current integrator, as described previously.

Diagram 1601 shows the equivalent circuit in the first phase 711a between t0 and t1. In the first phase 711a, the control signal ϕ1 is biasing the CMOS inverters M1 and M2 into its Vth_inv region. The one or more FeCaps are used to store the voltage $V_{ϕ1}$. The stored voltage $V_{ϕ1}$, may pre-bias the input 622 of the inverter 1602 during the second phase 711b.

Diagram 1603 shows the equivalent circuit in the second phase 711b. In the second phase 711b, the FeCap of the addressed memory cell 902 outputs the readout current 101, which is integrated by the capacitor 602.

In comparison with the AMP implementing the current integrator, the inverter 1202 implementing the current integrator enables to reduce the number of bias voltages. For example, no bias voltages are needed. This may enable to reduce the number of circuit elements, and thus, reduce the size of the circuit.

$V_{REF1}$ may be generated automatically and may be about VDD/2 for a symmetrical inverter 1202. This removes the overhead on $V_{READ}$. The input capacitance is kept small when utilizing minimum size devices.

Optionally, a high open loop gain is achievable when using the cascode transistors in the inverter 1202.

Figure 17:
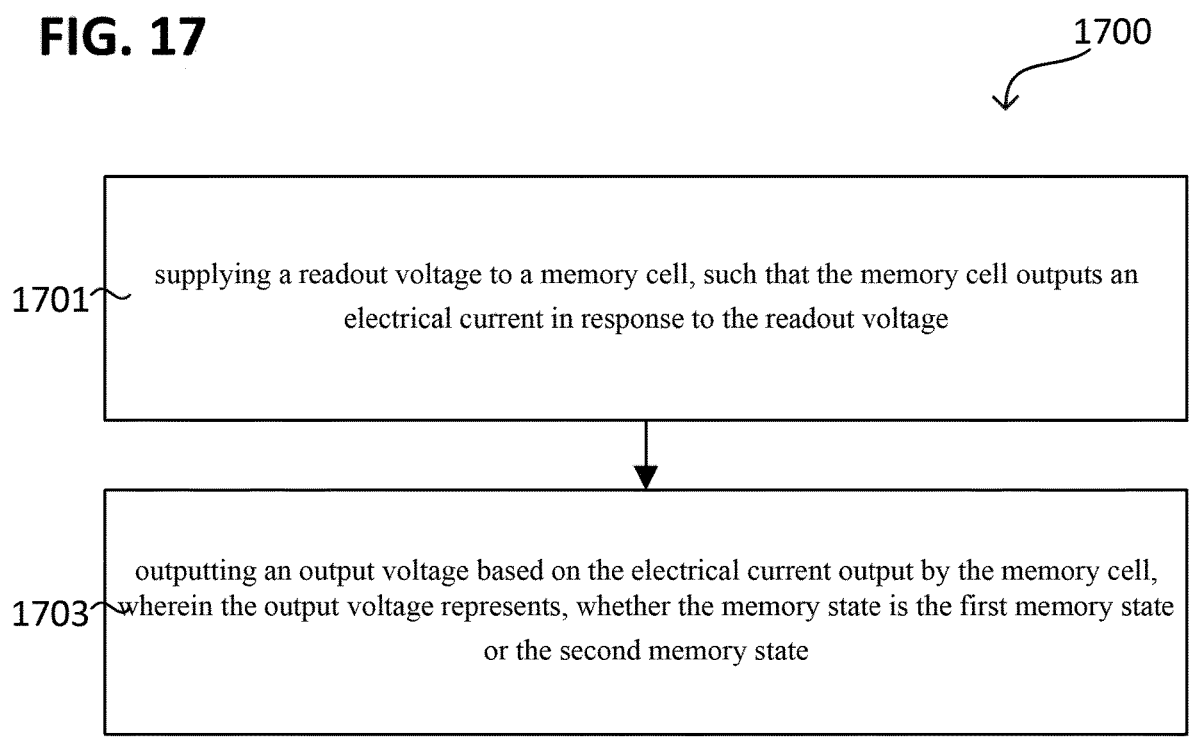
FIG. 17 schematically shows an exemplary method for reading out a memory cell, according to various aspects.

FIG. 17 illustrates schematically a method 700 for reading out a memory cell 102, according to various aspects 1700, in a flow diagram. The method includes, in 1701, supplying a readout voltage to a memory cell, such that the memory cell outputs an electrical current in response to the readout voltage, wherein a memory state of the memory cell is switchable between a first memory state and a second memory state. For example, the readout voltage may be configured, such that the memory state being in the first memory state switches to the second memory state. Additionally or alternatively, the readout voltage may be configured, such that the memory state being in the second memory state maintains the second memory state (is not switched).

The method includes, in 1703, providing (e.g., outputting) an output voltage based on the electrical current output by the memory cell, wherein the output voltage represents, whether the memory state is the first memory state or the second memory state (at the time the readout voltage is received). The output voltage may be converted based on the electrical current, e.g., based on an integral of the electrical current.

In the following, various examples are provided that may include one or more aspects described above with reference to the memory cell circuit 100, the memory cell 102, and the methods thereof. It is intended that aspects described in relation to the memory cell circuit 100 and/or the memory cell 102 may apply to the methods thereof, and vice versa.

Example 1 is a memory cell circuit, including: a memory cell configured to be in a respective memory state of at least two memory states, the memory cell including a first terminal and a second terminal (e.g., to address the memory cell); an optional supply circuit coupled to the first terminal of the memory cell, wherein the supply circuit is configured to provide a readout voltage to the first terminal of the memory cell (e.g., during a read-out time interval); a sense circuit coupled to the second terminal of the memory cell to receive a current signal from the memory cell in response to the readout voltage provided to the first terminal of the memory cell (e.g., during the readout time interval), wherein the sense circuit is configured to output an output voltage based on the received current signal, the output voltage representing the respective memory state.

Example 2 is the memory cell circuit of example 1, wherein the sense circuit is configured to integrate the current signal and to provide the output voltage based on the integrated current signal (i.e. the sense circuit is or includes a current integrator circuit).

Example 3 is the memory cell circuit of example 2, wherein the sense circuit is configured to integrate the current signal via charging or discharging at least one capacitor, wherein the voltage of the charged or discharged capacitor represents the respective memory state.

Example 4 is the memory cell circuit of example 3, wherein the sense circuit is configured to amplify the voltage of the charged or discharged capacitor and wherein the amplified voltage is output as the output voltage.

Example 5 is the memory cell circuit of example 4, wherein the sense circuit includes an operational amplifier, preferably an operational transconductance amplifier (OTA), to amplify the voltage of the charged or discharged capacitor.

Example 6 is the memory cell circuit of example 4, wherein the sense circuit includes an inverter, preferably a CMOS inverter, to amplify the voltage of the charged or discharged capacitor.

Example 7 is the memory cell circuit of any one of examples 1 to 6, wherein the sense circuit includes at least one switch coupled in parallel to the at least one capacitor to reset the at least one capacitor, e.g., during a first phase (also referred to as reset phase) of the read-out time interval subsequent or prior to a second phase of the read-out time interval.

Example 8 is the memory cell circuit of any one of examples 1 to 7, wherein the readout voltage is higher than a switching voltage to switch the memory cell from a first memory state of the at least two memory states into a second memory state of the at least two memory states (e.g., during the readout time interval), in the case the respective memory state is the first memory state.

Example 9 is the memory cell circuit of any one of examples 1 to 8, wherein the readout voltage is configured to switch the memory cell from a first memory state of the at least two memory states into a second memory state of the at least two memory states (e.g., during the readout time interval), in the case the memory cell is in the first memory state.

Example 10 is the memory cell circuit of any one of examples 1 to 9, wherein the readout voltage is configured such that the memory cell is not switched from the second memory state of the at least two memory states into the first memory state of the at least two memory states (e.g., during the readout time interval) in the case the respective memory state is the second memory state.

Example 11 is the memory cell circuit of any one of examples 1 to 10, wherein the memory cell includes a remanently polarizable portion, wherein a first remanent polarization of the remanently polarizable portion defines a first memory state of the memory cell and wherein a second remanent polarization of the remanently polarizable portion defines a second memory state of the memory cell.

Example 12 is the memory cell circuit of any one of examples 1 to 11, wherein the memory cell includes a ferroelectric capacitor, or wherein the memory cell is a ferroelectric capacitor.

Example 13 is the memory cell circuit of any one of examples 1 to 12, wherein the current signal includes a first characteristic (e.g., current-time-characteristic) in the case that the memory cell is switched during the read-out time interval, and wherein the current signal includes a second characteristic (e.g., current-time-characteristic) in the case that the memory cell is not switched during the read-out time interval.

Example 14 is the memory cell circuit of examples 1 to 13, wherein the output voltage (e.g., its amplitude) is in a first voltage range in the case that the current signal includes the first characteristic, and wherein the output voltage (e.g., its amplitude) is in a second voltage range different from the first voltage range in the case that the current signal includes the second characteristic.

Example 15 is the memory cell circuit of any one of examples 1 to 14, further including: a comparator configured to receive the output voltage and to compare the output voltage with at least one reference voltage to provide a digital representative of the determined memory state of the memory cell based on the received output voltage.

Example 16 is the memory cell circuit of any one of examples 1 to 15, further including: a dummy memory cell, configured to be in a memory state, the dummy memory cell including a first terminal and a second terminal (e.g., to address the dummy memory cell); wherein the supply circuit is coupled to the first terminal of the dummy memory cell and configured to provide a support readout voltage to the first terminal of the dummy memory cell during the read-out time interval; wherein the sense circuit is coupled to the second terminal of the dummy memory cell to receive a support current signal from the dummy memory cell in response to the support readout voltage provided to the first terminal of the dummy memory cell (e.g., during the readout time interval), wherein the sense circuit is configured to output the output voltage based on both the received current signal and the received support current signal.

Example 17 is the memory cell circuit of example 16, wherein the support readout voltage and the read out voltage are provided with opposite polarities and/or simultaneously.

Example 18 is the memory cell circuit of example 16 to 17, wherein the support current signal and the current signal have opposite polarities (e.g., opposite current directions).

Example 19 is the memory cell circuit of any one of examples 1 to 18, wherein the current signal and the support current signal compensate each other substantially completely in the case that the memory cell is not switched during the read-out time interval, and wherein the current signal and the support current signal compensate each other partially in the case that the memory cell is switched during the read-out time interval, the remaining current signal representing a dielectric current due to the switching of the memory cell (e.g., during the readout time interval).

Example 20 is the memory cell circuit of any one of examples 1 to 19, further including: a select transistor coupled in series in a current path from the second terminal of the memory cell to an input node of the sense circuit.

Example 21 is the memory cell circuit of any one of examples 1 to 20, further including: a controller coupled to the supply circuit and the sense circuit, the control circuit being configured to control the supply of the readout voltage and the support readout voltage (e.g., during the readout time interval) and to control the sense circuit to sense the current signal and the supply current signal (e.g., during the readout time interval). The controller is optionally further configured to control the reset of the at least one capacitor of the sense circuit in the case that the sense circuit is configured as a current integrator circuit.

Example 22 is a memory cell circuit (e.g., in accordance with any one of examples 1 to 21), including: a memory cell configured to be switchable from a first memory state of at least two memory states to a second memory state of at least two memory states; a switching sense circuit coupled to the memory cell to receive a current signal from the memory cell, the switching sense circuit being configured to determine a parameter representing a switching charge associated with the switching of the memory cell based on the current signal.

Example 23 is the memory cell circuit of example 22, wherein the switching sense circuit includes an electronic current integrator configured to generate a voltage output proportional to an integrated value of the current signal, the voltage output being the parameter representing the switching charge.

Example 24 is the memory cell circuit of example 22 or 23, wherein the memory cell is a capacitor-based memory cell, and wherein the switching charge is associated with a dielectric current generated due to the switching of the capacitor-based memory cell.

Example 25 is a memory cell circuit, including: a set of memory cells, a first control line (e.g., bit-line) connecting the memory cells of the set of memory cells; a set of second control lines (e.g., word-lines), each second control line being connected to a respective memory cell of the set of memory cells; a supply circuit configured to switch a memory cell of the set of memory cells by providing a readout voltage to the memory cell; a switching sense circuit coupled to the first control line, the switching sense circuit being configured to determine a parameter representing the switching of the memory cell of the set of memory cells based on a current signal provided from the memory cell to the switching sense circuit via the first control line.

Example 26 is a memory cell circuit (e.g., in accordance to any one of examples 1 to 25), including: a memory cell, wherein a memory state of the memory cell is switchable between a first memory state and a second memory state (that is from the first memory state to the second memory state or from the second memory state to the first memory state), the memory cell is further configured to output an electrical current (e.g., the electrical current is a function of the memory state) in response to receiving a readout voltage; a sense circuit configured to output an output voltage based on the electrical current output by the memory cell, wherein the output voltage represents, whether the memory state is the first memory state or the second memory state (at the time the readout voltage is received), e.g., whether the memory state is switched or not.

Example 27 is the memory cell circuit of example 26, further including: a supply circuit configured to apply the readout voltage to the memory cell, e.g., in in response to receiving a readout instruction and/or during a read-out time interval.

Example 28 is the memory cell circuit of example 26 or 27, further including: a timing circuit configured to provide a control signal representing the read-out time interval.

Example 29 is the memory cell circuit of one of examples 26 to 28, wherein the memory cell is configured to output an current pulse as electrical current (e.g., the current pulse is a function of the memory state) in response to receiving a readout voltage.

Example 30 is the memory cell circuit of one of example 26 to 29, further including: an addressing circuit configured to address the memory cell and direct the readout voltage to the addressed memory cell, e.g., in response to receiving a readout instruction and/or during a read-out time interval.

Example 31 is the memory cell circuit of one of example 26 to 30, wherein the sense circuit is configured to integrate the electrical current and to provide the output voltage based on a result of the integrating of the electrical current (e.g., on the integrated current).

Example 32 is the memory cell circuit of example 31, wherein the sense circuit includes or is formed from a current integrator circuit.

Example 33 is the memory cell circuit of one of example 26 to 32, wherein the sense circuit includes at least one circuit element including a capacitance, the sense circuit is configured to charge or discharge the capacitance by the electrical current, wherein the output voltage is based on a result of the charging or discharging the capacitance, wherein preferably the result of the charging or discharging the capacitance includes a voltage.

Example 34 is the memory cell circuit of example 33, wherein the sense circuit includes a converter, preferably a voltage-to-voltage converter, configured to convert the result of the charging or discharging of the capacitance into the output voltage, wherein preferably an input side of the converter is coupled to the at least one circuit element, and/or wherein preferably an output side of the converter is coupled to the at least one circuit element (e.g., the at least one circuit element coupled providing a feedback path of the converter).

Example 35 is the memory cell circuit of example 34, wherein the converter includes an operational amplifier, preferably an operational transconductance amplifier (OTA), wherein preferably an input side of the operational amplifier is coupled to the at least one circuit element, and/or wherein preferably an output side of the amplifier is coupled to the at least one circuit element (e.g., the at least one circuit element coupled providing a feedback path of the amplifier).

Example 36 is the memory cell circuit of example 35, wherein the operational amplifier is configured to provide the output voltage.

Example 37 is the memory cell circuit of one of examples 34 to 36, wherein the converter includes an inverter, preferably a CMOS inverter, wherein an input side of the inverter is coupled to the at least one circuit element.

Example 38 is the memory cell circuit of example 37, wherein an output side of the inverter is coupled to the at least one circuit element (e.g., the at least one circuit element coupled providing a feedback path of the inverter).

Example 39 is the memory cell circuit of example 37 or 38, wherein the inverter is configured to amplify a voltage of the capacitance and/or to provide the output voltage.

Example 40 is the memory cell circuit of one of examples 33 to 39, wherein the sense circuit includes at least one switch coupled in parallel to the at least one circuit element to reset the capacitance, e.g., during a reset time interval subsequent to the read-out time interval and/or subsequent to the outputting of the output voltage.

Example 41 is the memory cell circuit of one of example 26 to 40, wherein the memory cell is configured to switch the memory state between the first memory state and the second memory state in response to receiving a switching voltage, wherein the readout voltage is higher the switching voltage.

Example 42 is the memory cell circuit of example 41, wherein the memory cell is configured to switch the memory state from the first memory state into the second memory state in response to receiving the switching voltage.

Example 43 is the memory cell circuit of one of examples 26 to 42, wherein the memory cell is configured such that the first memory state is switched to the second memory state when the memory cell receives a switching voltage and the second memory state is maintained when the memory cell receives a switching voltage, wherein preferably the readout voltage is more than the switching voltage.

Example 43 is the memory cell circuit of one of examples 26 to 42, wherein the readout voltage is configured to switch the memory state from the first memory state to the second memory state.

Example 44 is the memory cell circuit of one of examples 26 to 43, wherein the readout voltage is configured such that memory state maintains the second memory state, when the readout voltage is received.

Example 45 is the memory cell circuit of one of examples 26 to 44, further including: an analog-to-digital converter configured to convert the output voltage into a digital representative of the memory state.

Example 46 is the memory cell circuit of example 45, wherein the analog-to-digital converter includes a comparator configured to compare the output voltage with at least one reference voltage and to provide the digital representative based on a result of the comparison.

Example 47 is the memory cell circuit of one of examples 26 to 46, wherein the memory cell includes a remanently polarizable portion, wherein switching polarization of the remanently polarizable portion switches the memory state.

Example 48 is the memory cell circuit of one of examples 26 to 47, wherein the memory cell includes a remanently polarizable portion, wherein the memory state is the first memory state when the remanently polarizable portion is in a first remanent polarization state, wherein the memory state is the second memory state when the remanently polarizable portion is in a second remanent polarization state.

Example 49 is the memory cell circuit of one of examples 26 to 48, wherein the memory cell includes a ferroelectric capacitor, or wherein the memory cell is a ferroelectric capacitor. In some aspects, the memory cell includes a spontaneously polarizable material (e.g., implemented as a functional layer disposed between two electrodes). The spontaneously polarizable material may be a ferroelectric or anti-ferroelectric material. The spontaneously polarizable material may be a remanently or non-remanently polarizable material.

Example 50 is the memory cell circuit of one of examples 26 to 49, wherein the electrical current includes of first characteristic (e.g., current-time-characteristic) when the memory state is switched; and wherein the electrical current includes of second characteristic (e.g., current-time-characteristic) when the memory state is maintained.

Example 51 is the memory cell circuit of example 50, wherein the first characteristic and the second characteristic differ from each other.

Example 52 is the memory cell circuit of one of examples 26 to 51, further including: a dummy memory cell configured to output a further electrical current (e.g., the further electrical current is a function of a memory state of the dummy memory cell) in response to receiving a further readout voltage (also referred to as support readout voltage or dummy voltage) and/or the readout voltage; wherein the sense circuit is further configured to output the output voltage further based on the further electrical current, e.g., by superposing (e.g., interfering) the electrical current and the further electrical current.

Example 53 is the memory cell circuit of example 52, wherein the further readout voltage and the read out voltage are provided with opposite polarities and/or simultaneously to each other; and/or wherein the further electrical current and the electrical current are opposite to each other (e.g., opposite current directions).

Example 54 is the memory cell circuit of example 52 or 53, wherein the further electrical current compensates at least a first current component of the electrical current, wherein preferably, the first current component, when the memory state is maintained, equals the first current component, when the memory state is switched.

Example 55 is the memory cell circuit of example 54, wherein a second current component of the electrical current remaining from the compensation represents a switching charge current resulting from a switching of the memory state.

Example 56 is the memory cell circuit of one of examples 26 to 55, further including: a controller configured to control the readout voltage and/or the further readout voltage and/or to control the sense circuit, wherein the controller is optionally further configured to control the reset.

Example 57 is a memory cell circuit including: a set of memory cells, a first control line (e.g., bit-line) connecting the memory cells of the set of memory cells; a set of second control lines (e.g., word-lines), each second control being connected to a respective memory cell of the set of memory cells; wherein a memory state of each of the memory cell is switchable between a first memory state and a second memory state, the memory cell further configured to output an electrical current via the first control line in response to receiving a readout voltage via one of the second control lines; a sense circuit configured to output an output voltage based on the electrical current output by the memory cell, wherein the output voltage represents, whether the memory state is the first memory state or the second memory state, e.g., whether the memory state is switched or not.

Example 58 is a memory cell circuit, including: a memory cell, wherein a memory state of the memory cell is switchable between a first memory state and a second memory state, the memory cell further configured to output an electrical current in response to receiving a readout voltage; a sense circuit configured to determine a parameter representing a switching charge associated with a switching of the memory state based on the electrical current.

Example 59 is the memory cell circuit of example 58, wherein the sense circuit includes an electronic current integrator configured to output an output voltage proportional to an integral of the electrical current, the output voltage being the parameter representing the switching charge.

Example 60 is the memory cell circuit of example 58 or 59, wherein the memory cell is a capacitor-based memory cell, and wherein the switching charge is associated with a switching charge current generated due to the switching of the capacitor-based memory cell.

Example 61 is a method for reading out a memory cell (e.g., configured according to any of the examples 1 to 60), including: supplying a readout voltage to the memory cell, such that the memory cell outputs an electrical current in response to the readout voltage, wherein a memory state of the memory cell is switchable between a first memory state and a second memory state; providing an output voltage based on the electrical current output by the memory cell, wherein the output voltage represents, whether the memory state is the first memory state or the second memory state, e.g., whether the memory state is switched or not.

Example 62 is the memory cell circuit of one of examples 1 to 61, wherein the sense circuit is configured to convert the electrical current (e.g., the amperage and/or the totally transferred charge) output by the memory cell into the output voltage.

Example 63 is the memory cell circuit of one of examples 1 to 62, wherein the sense circuit includes a current-to-voltage converter or is formed from a current-to-voltage converter.

Example 64 is the memory cell circuit of one of examples 1 to 63, wherein the sense circuit is configured to sense the electrical current output by the memory cell.

Example 65 is the memory cell circuit of one of examples 1 to 63, wherein the memory cell is configured to supply the electrical current output by the memory cell to the sense circuit.

Example 66 is a sense circuit (e.g., being the sense circuit of the memory cell circuit of one of examples 1 to 65), including: an inverter including two or more (e.g., four or more) cascode transistors (e.g., CMOS cascode transistors), preferably between which an output side of the inverter is coupled, e.g., the input side of the inverter providing an input terminal of the sense circuit (e.g., being coupled to the memory cell) and/or an output side of the inverter providing an output terminal of the sense circuit.

Example 67 is the sense circuit (e.g., being the sense circuit of the memory cell circuit of one of examples 1 to 65) of example 66, wherein the two or more (e.g., four or more) cascode transistors are coupled in series to each other.

Example 68 is the sense circuit (e.g., being the sense circuit of the memory cell circuit of one of examples 1 to 65) of example 66 or 67, wherein the two or more (e.g., four or more) cascode transistors include two first transistors (e.g., M3 and M4).

Example 69 is the sense circuit (e.g., being the sense circuit of the memory cell circuit of one of examples 1 to 65) of example 68, further including: a node and/or a controlled switch coupled between the two first transistors; wherein the node is capacitively (e.g., by a capacitor) coupled to an input terminal of the sense circuit and/or to an output terminal of the sense circuit; and/or wherein the controlled switch is coupled parallel to the capacitor and/or coupled to at least one of: the input terminal of the sense circuit and/or the output terminal of the sense circuit.

Example 70 is the sense circuit (e.g., being the sense circuit of the memory cell circuit of one of examples 1 to 65) of example 68 or 69, further comprising: a first control terminal coupled to one of the two first transistors; and/or a second control terminal coupled to the other one of the two first transistors; e.g., the first control terminal and the second control terminal being separated from each other.

Example 71 is the sense circuit (e.g., being the sense circuit of the memory cell circuit of one of examples 1 to 65)

of one of examples 66 to 70, further comprising: an input terminal and an output terminal, between which the two or more (e.g., four or more) cascode transistors are coupled.

Example 72 is the sense circuit (e.g., being the sense circuit of the memory cell circuit of one of examples 1 to 65) of one of examples 66 to 71, further comprising: two second transistors, which are coupled to each other by the cascode transistors.

Example 73 is the sense circuit (e.g., being the sense circuit of the memory cell circuit of one of examples 1 to 65) of example 72, wherein the each of the two second transistors (e.g., their gate) is coupled to an input terminal of the sense circuit and/or is capacitively coupled to an output terminal of the sense circuit.

Example 74 is the sense circuit (e.g., being the sense circuit of the memory cell circuit of one of examples 1 to 65) of example 72 or 73, wherein each of the two second transistors (e.g., their gate) is coupled to the controlled switch of the sense circuit.

Example 75 is the sense circuit (e.g., being the sense circuit of the memory cell circuit of one of examples 1 to 65) of examples 72 to 74, wherein each of the two second transistors (e.g., their source or drain) is coupled to one of the two or more cascode transistors.

Example 76 is the sense circuit (e.g., being the sense circuit of the memory cell circuit of one of examples 1 to 65) of examples 72 to 75, wherein the two or more cascode transistors are coupled between the two second transistors.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell circuit, comprising:
a memory cell, wherein a memory state of the memory cell is switchable between a first memory state and a second memory state, the memory cell further configured to output an electrical current in response to receiving a readout voltage; and
a sense circuit configured to output an output voltage based on the electrical current output by the memory cell, wherein the output voltage represents whether the memory state is the first memory state or the second memory state, wherein the sense circuit comprises a single-input inverter and an integrating capacitor, wherein the integrating capacitor couples an input node of the single-input inverter to an output of the single-input inverter that inverts signals as between the input node and the output,
wherein the single-input inverter comprises a first transistor pair cascaded with a second transistor pair, wherein the input node comprises connected gates of a first transistor of the first transistor pair and of a first transistor of the second transistor pair, wherein the output of the single-input inverter is connected between a second transistor of the first transistor pair cascaded with a second transistor of the second transistor pair, wherein a gate of the second transistor of the first transistor pair is connected to a first control terminal that is separate from the input node, wherein a gate of the second transistor of the second transistor pair is connected to a second control terminal that is separate from the input node,
wherein the first transistor of the first transistor pair is connected to a supply voltage and remains connected to the supply voltage even when the second transistor of the first transistor pair is switched off, wherein the first transistor of the second transistor pair is connected to a reference voltage and remains connected to the reference voltage when the second transistor of the second transistor pair is switched off.

2. The memory cell circuit of claim 1, further comprising: a supply circuit configured to apply the readout voltage to the memory cell.

3. The memory cell circuit of claim 1, wherein the sense circuit is configured to integrate the electrical current and to provide the output voltage based on a result of the integrating of the electrical current.

4. The memory cell circuit of claim 1, wherein the integrating capacitor comprises a capacitance, wherein the sense circuit is configured to charge or discharge the capacitance by the electrical current, wherein the output voltage is based on a result of the charging or discharging the capacitance, wherein the result of the charging or discharging the capacitance comprises a voltage.

5. The memory cell circuit of claim 4, wherein the single-input inverter is configured to convert the result of the charging or discharging of the capacitance into the output voltage.

6. The memory cell circuit of claim 1, wherein the single-input inverter comprises a first transistor cascaded with a second transistor, between which the output of the single-input inverter is coupled, wherein the input node comprises gates of the first and second transistors connected together.

7. The memory cell circuit of claim 1, wherein:
the first control terminal coupled that sets a first output voltage level of the single-input inverter, and
the second control terminal sets a second output voltage level of the single-input inverter.

8. The memory cell circuit of claim 4, wherein the sense circuit comprises at least one switch coupled in parallel to the integrating capacitor to selectively reset the capacitance of the capacitor.

9. The memory cell circuit of claim 1, wherein the readout voltage is configured to switch the memory state from the first memory state to the second memory state.

10. The memory cell circuit of claim 1, wherein the readout voltage is configured such that memory state maintains the second memory state, when the readout voltage is received.

11. The memory cell circuit of claim 1, further comprising:
an analog-to-digital converter configured to convert the output voltage into a digital representative of the memory state.

12. The memory cell circuit of claim 1, wherein the memory cell comprises a ferroelectric capacitor, or wherein the memory cell is a ferroelectric capacitor.

13. The memory cell circuit of claim 1, wherein the electrical current comprises a first characteristic when the memory state is switched; and wherein the electrical current comprises of second characteristic when the memory state is maintained.

14. The memory cell circuit of claim 1, further comprising:

a dummy memory cell configured to output a further electrical current in response to receiving a further readout voltage and/or the readout voltage, wherein the sense circuit is further configured to output the output voltage based on the further electrical current.

15. A memory cell circuit, comprising:

a set of memory cells, a first control line connecting the memory cells of the set of memory cells;

a set of second control lines, each second control being connected to a respective memory cell of the set of memory cells, wherein a memory state of each of the memory cell is switchable between a first memory state and a second memory state, the memory cell further configured to output an electrical current via the first control line in response to receiving a readout voltage via one of the second control lines; and a sense circuit configured to output an output voltage based on the electrical current output by the memory cell, wherein the output voltage represents whether the memory state is the first memory state or the second memory state, wherein the sense circuit comprises a single-input inverter and an integrating capacitor, wherein the integrating capacitor couples an input the of the single-input inverter to an output of the single-input inverter, wherein the single-input inverter inverts signals as between the input node and the output, wherein the single-input inverter comprises a first transistor pair cascaded with a second transistor pair, wherein the input node comprises connected gates of a first transistor of the first transistor pair and of a first transistor of the second transistor pair, wherein the output of the single-input inverter is connected between a second transistor of the first transistor pair cascaded with a second transistor of the second transistor pair, wherein a gate of the second transistor of the first transistor pair is connected to a first control terminal that is separate from the input node, wherein a gate of the second transistor of the second transistor pair is connected to a second control terminal that is separate from the input node, wherein the first transistor of the first transistor pair is connected to a supply voltage and remains connected to the supply voltage even when the second transistor of the first transistor pair is switched off, wherein the first transistor of the second transistor pair is connected to a reference voltage and remains connected to the reference voltage when the second transistor of the second transistor pair is switched off.

* * * * *